(12) United States Patent
Kumagai et al.

(10) Patent No.: US 6,538,338 B2
(45) Date of Patent: Mar. 25, 2003

(54) STATIC RAM SEMICONDUCTOR MEMORY DEVICE HAVING REDUCED MEMORY

(75) Inventors: Takashi Kumagai, Suwa (JP); Masahiro Takeuchi, Suwa (JP); Satoru Kodaira, Suwa (JP); Takafumi Noda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/876,059

(22) Filed: Jun. 8, 2001

(65) Prior Publication Data

US 2002/0009002 A1 Jan. 24, 2002

(30) Foreign Application Priority Data

Jun. 22, 2000 (JP) .......................................... 2000-187986

(51) Int. Cl.$^7$ .............................................. H01L 27/11
(52) U.S. Cl. ........................... 257/903; 257/390; 365/63
(58) Field of Search ................................ 257/903, 390, 257/391, 393, 67, 369, 385; 365/63

(56) References Cited

U.S. PATENT DOCUMENTS

| | | | |
|---|---|---|---|
| 4,827,449 A | * 5/1989 | Inoue | ........................... 365/63 |
| 5,404,030 A | * 4/1995 | Kim et al. | ..................... 257/67 |
| 6,147,385 A | * 11/2000 | Kim et al. | ................... 257/369 |
| 6,469,356 B2 | 6/2001 | Kumagai et al. | |
| 6,229,186 B1 | * 8/2001 | Ishida | ........................ 257/390 |
| 6,271,542 B1 | * 8/2001 | Emma et al. | .................. 257/67 |
| 2002/0008266 A1 | 1/2002 | Kumagai et al. | |
| 2002/0024856 A1 | 2/2002 | Kumagai et al. | |

FOREIGN PATENT DOCUMENTS

| | | |
|---|---|---|
| JP | A 09-260510 | 10/1997 |
| JP | A 10-041409 | 2/1998 |

OTHER PUBLICATIONS

US patent application 2001/00381133 by Song (publiaction date Nov. 8, 2001) US.*
IEDM Technical Digest 1998 by M. Ishida et al.

* cited by examiner

*Primary Examiner*—David Nelms
*Assistant Examiner*—Thinh T. Nguyen
(74) *Attorney, Agent, or Firm*—Oliff & Berridge, PLC

(57) ABSTRACT

The invention provides SRAMs that can reduce memory cells in size and correct light proximity effect. Gate electrode layers in a first layer, drain—drain connection layers in a second layer, and drain-gate connection layers in a third layer define conduction layers of a flip-flop. Driver transistors of one memory cell do not commonly share the n+ type source region with driver transistors of another memory cell.

7 Claims, 18 Drawing Sheets

STATIC RAM SEMICONDUCTOR MEMORY DEVICE HAVING REDUCED MEMORY

BACKGROUND OF THE INVENTION

1. Field of Invention

The present invention relates to semiconductor memory devices such as SRAMs (static random access memories).

2. Description of Related Art

SRAMs, one type of semiconductor memory devices, do not require a refreshing operation, and therefore have characteristics that can simplify a system in which they are incorporated and facilitate lower power consumption. For this reason, the SRAMs are prevailingly used as memories for hand-carry type equipment, such as cellular phones.

It is preferable for the hand-carry type equipment needs to be reduced in size. Therefore, the memory size of the SRAMs must be reduced.

SUMMARY OF THE INVENTION

It is an object of the present invention to provide a semiconductor memory device that can reduce the size of memory cells.

In accordance with the present invention, a semiconductor memory device has a plurality of memory cells, each of the memory cells including a first driver transistor, a second driver transistor, a first load transistor, a second load transistor, a first transfer transistor and a second transfer transistor. The memory cell includes first and second gate electrode layers, first and second drain—drain connection layers and first and second drain-gate connection layers. The first gate electrode layer includes gate electrodes of the first driver transistor and the first load transistor. The second gate electrode layer includes gate electrodes of the second driver transistor and the second load transistor. The first drain—drain connection layer connects a drain region of the first driver transistor and a drain region of the first load transistor. The second drain—drain connection layer connects a drain region of the second driver transistor and a drain region of the second load transistor. The first drain-gate connection layer connects the first drain—drain connection layer and the second gate electrode layer. The second drain-gate connection layer connects the second drain—drain connection layer and the first gate electrode layer. The drain—drain connection layers, the drain-gate connection layers and the gate electrode layers are provided in different layers, in plan view. The first and second gate electrode layers are positioned between the first drain—drain connection layer and the second drain—drain connection layer. The driver transistors of one of the memory cells does not commonly share a source region of the driver transistor of another of the memory cells.

The present invention is equipped with gate electrode layers that become gates of inverters, drain—drain connection layers that connect drains of the inverters, and drain-gate connection layers that connect gates of one of the inverters and drains of the other of the inverters. In accordance with the present invention, three layers (gate electrode layers, drain—drain connection layers, and drain-gate connection layers) are used to form a flip-flop. Accordingly, patterns in each layer can be simplified (for example, into linear patterns) compared to the case in which a flip-flop is formed using two layers. In this manner, in accordance with the present invention, since the patterns in each layer can be simplified, a miniaturized semiconductor memory device with its memory cell size being 4.5 $\mu m^2$ or smaller, for example, can be manufactured.

Also, in accordance with the present invention, in plan view, the first and second gate electrode layers are located between the first drain—drain connection layer and the second drain—drain connection layer. As a result, the source contact layer of the driver transistors can be disposed in the central area of the memory cell. Furthermore, a wiring that connects the source contact layer and the grounding line can be disposed in the same layer as the drain—drain connection layer and in the cell central area. Accordingly, the degree of freedom in forming the first and second drain-gate connection layers increases. This is also advantageous with regard to reducing the memory cell size. It is noted that, it the present invention, the "source contact layer" is a conduction layer that is used to connect a source region of the driver transistor and the wiring layer.

Also, in accordance with the present invention, a driver transistor of one memory cell does not commonly share a source region of a driver transistor of another memory cell. Accordingly, under any circumstances, only cell current for one-memory cell flows in the source region. As a result, in accordance with the present invention, the degree in the reduction of operation margin in a semiconductor memory device can be reduced, such that malfunctions of the semiconductor memory device can be prevented. This will be described in detail below.

In accordance with the present invention, in one of the memory cells, the first driver transistor commonly shares a source region of the second driver transistor. In accordance with the present invention, the first driver transistor and the second driver transistor commonly share a source region, such that the area of the source region can be made smaller. Accordingly, in accordance with the present invention, the semiconductor memory device can be reduced in size.

In accordance with the present invention, in one of the memory cells, a source region of the first and second driver transistors is located between the first gate electrode layer and the second gate electrode layer. In accordance with the present invention, in one memory cell, the first driver transistor can commonly share a source region with the second driver transistor.

The present invention also includes an auxiliary word line. The load transistors in one of the memory cells are arranged adjacent to each other in a direction in which the auxiliary word line extends, and do not commonly share a source region of the load transistors of another of the memory cells. In accordance with the present invention, since only cell current for one-memory cell flows in the source region of the load transistor, the degree in the reduction of operation margin can be reduced. As a result, malfunctions of the semiconductor memory device can be prevented. This will be described in detail below.

In accordance with the present invention, the first and second driver transistors are n-type, the first and second load transistors are p-type, and the first and second transfer transistors are n-type. The invention further includes first, second, third and fourth conduction layers. The first gate electrode layer, the second gate electrode layer and an auxiliary word line are located in the first conduction layer. The first drain—drain connection layer, the second drain—drain connection layer, a power supply line, a first contact pad layer, a second contact pad layer and a third contact pad layer are located in the second conduction layer. The first drain-gate connection layer, the second drain-gate connection layer, a main word line, a fourth contact pad layer, a fifth contact pad layer and a sixth contact pad layer are located in the third conduction layer. A first bit line, a second bit line and a grounding line are located in the fourth conduction layer. The auxiliary word line extends in a first direction. The power supply line connects to source regions of the first and second load transistors. The first contact pad layer is used to connect the first bit line and a source/drain region of the first transfer transistor. The second contact pad layer is used to connect the second bit line and a source/drain region of the second transfer transistor. The third contact pad layer is used to connect source regions of the first and second driver transistors and the grounding line. The main word line extends in the first direction. The fourth contact pad layer is used to connect the first bit line and the source/drain region of the first transfer transistor. The fifth contact pad layer is used to connect the second bit line and the source/drain region of the second transfer transistor. The sixth contact pad layer is used to connect the source regions of the first and second driver transistors and the grounding line. The first and second bit lines extend in a second direction perpendicularly traversing the first direction.

In accordance with the present invention, a variety of characteristics required for semiconductor memory devices (for example, reduced size, reliability, stability and speed) can be enhanced in a well-balanced manner.

In accordance with the present invention, the first gate electrode layer, the second gate electrode layer, the first drain—drain connection layer and the second drain—drain connection layer have linear patterns, respectively, and are disposed in parallel with one another. In accordance with the present invention, the patterns are simple, and therefore a semiconductor memory device having very small memory cells can be manufactured.

DETAILED DESCRIPTION OF PREFERRED EMBODIMENTS

A semiconductor memory device in accordance with one embodiment of the present invention is described. In this embodiment, the semiconductor memory device of the present invention is applied to an SRAM. First, a general structure of the embodiment of the present invention is described. Then, the structure is described in detail, and lastly, advantages of the present embodiment are described.

General Structure of the Present Embodiment

A semiconductor memory device in accordance with the present embodiment is a type that forms one memory cell with six MOS field effect transistors. A part of the structure that forms flip-flops of the memory cell and the structure of the memory cell are separately described to show the general structure of the present embodiment.

Structure of Part That Forms Flip-Flops of Memory Cell

Figure 1:
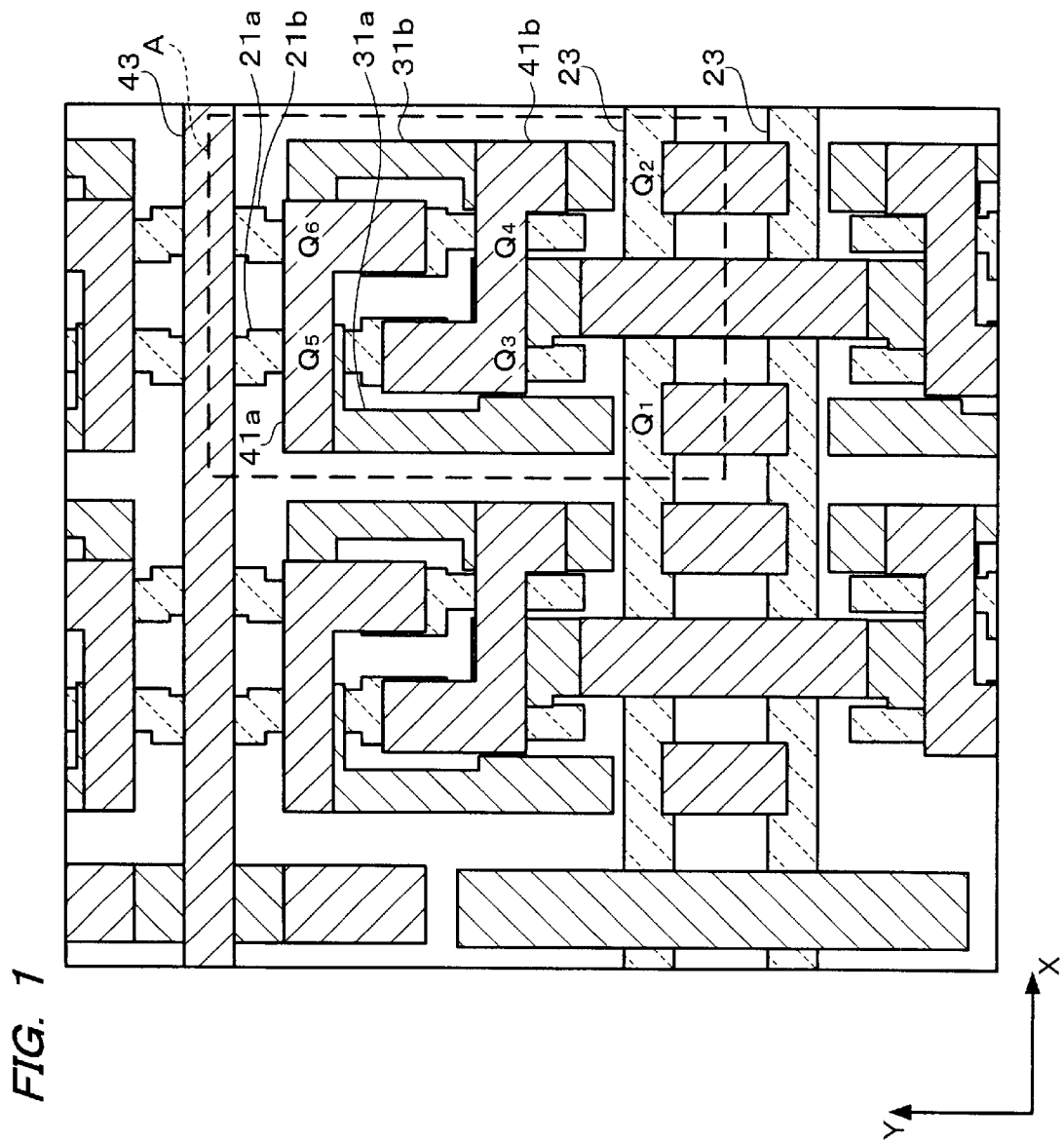
FIG. 1 is a plan view of first, second and third conduction layers in a part of a memory cell array in accordance with one embodiment of the present invention.

FIG. 1 is a plan view of part of a memory cell array in accordance with the present embodiment including first, second and third conduction layers. To facilitate understanding of FIG. 1, the first, second and third layers are individually described first.

Figure 3:
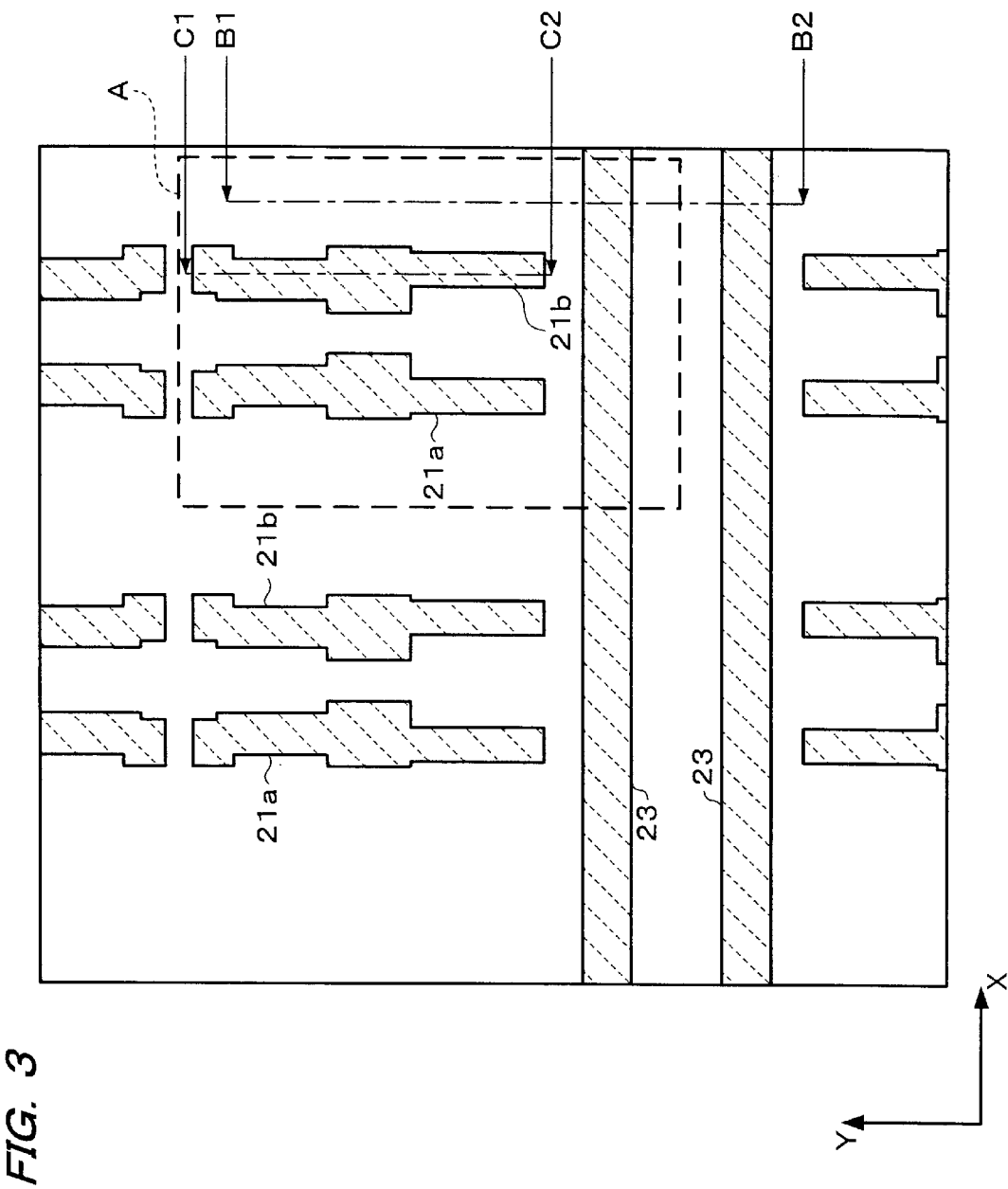
FIG. 3 is a plan view of a first conduction layer in a part of the memory cell array in accordance with one embodiment of the present invention.
Figure 5:
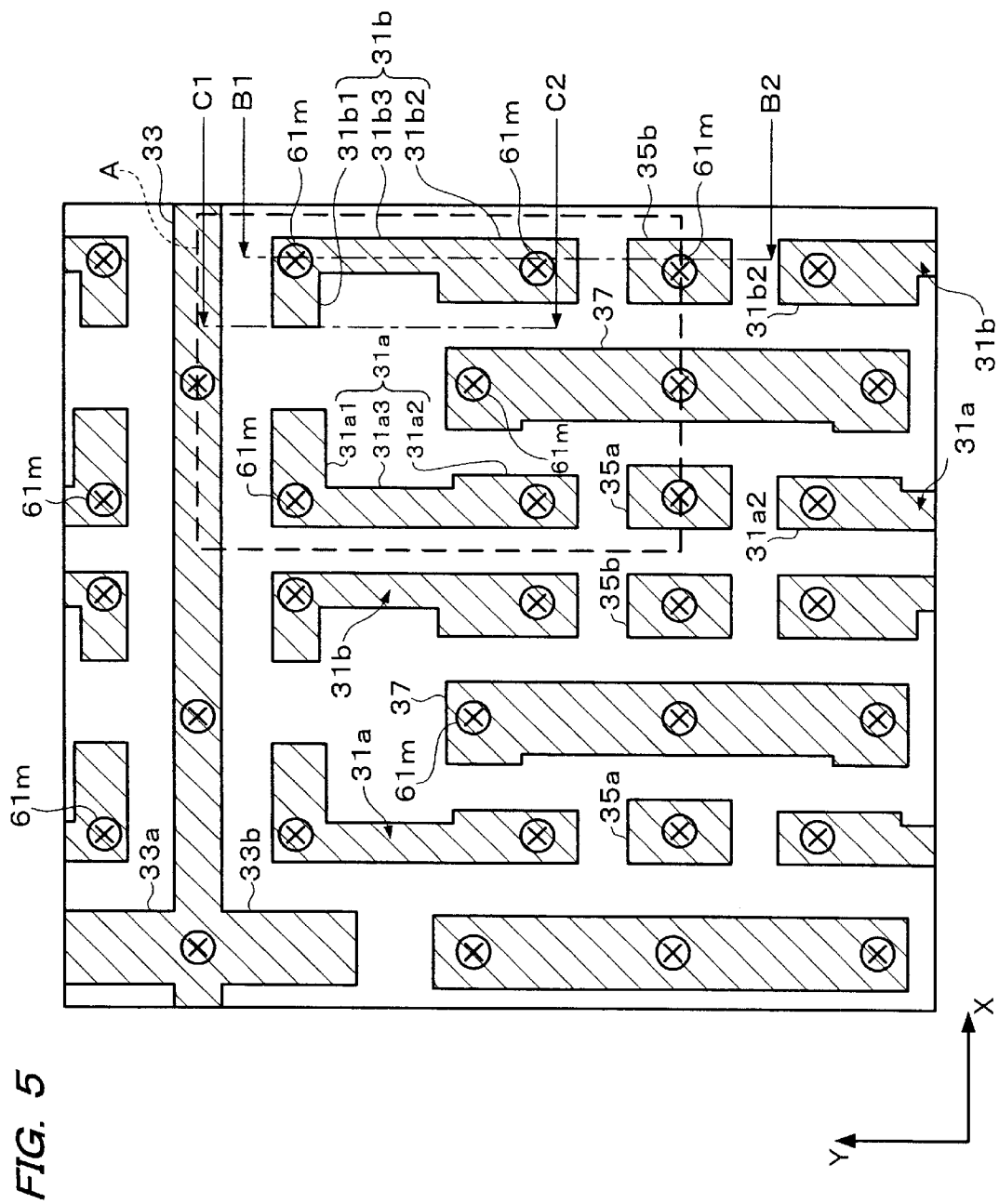
FIG. 5 is a plan view of a second conduction layer in a part of the memory cell array in accordance with one embodiment of the present invention.
Figure 8:
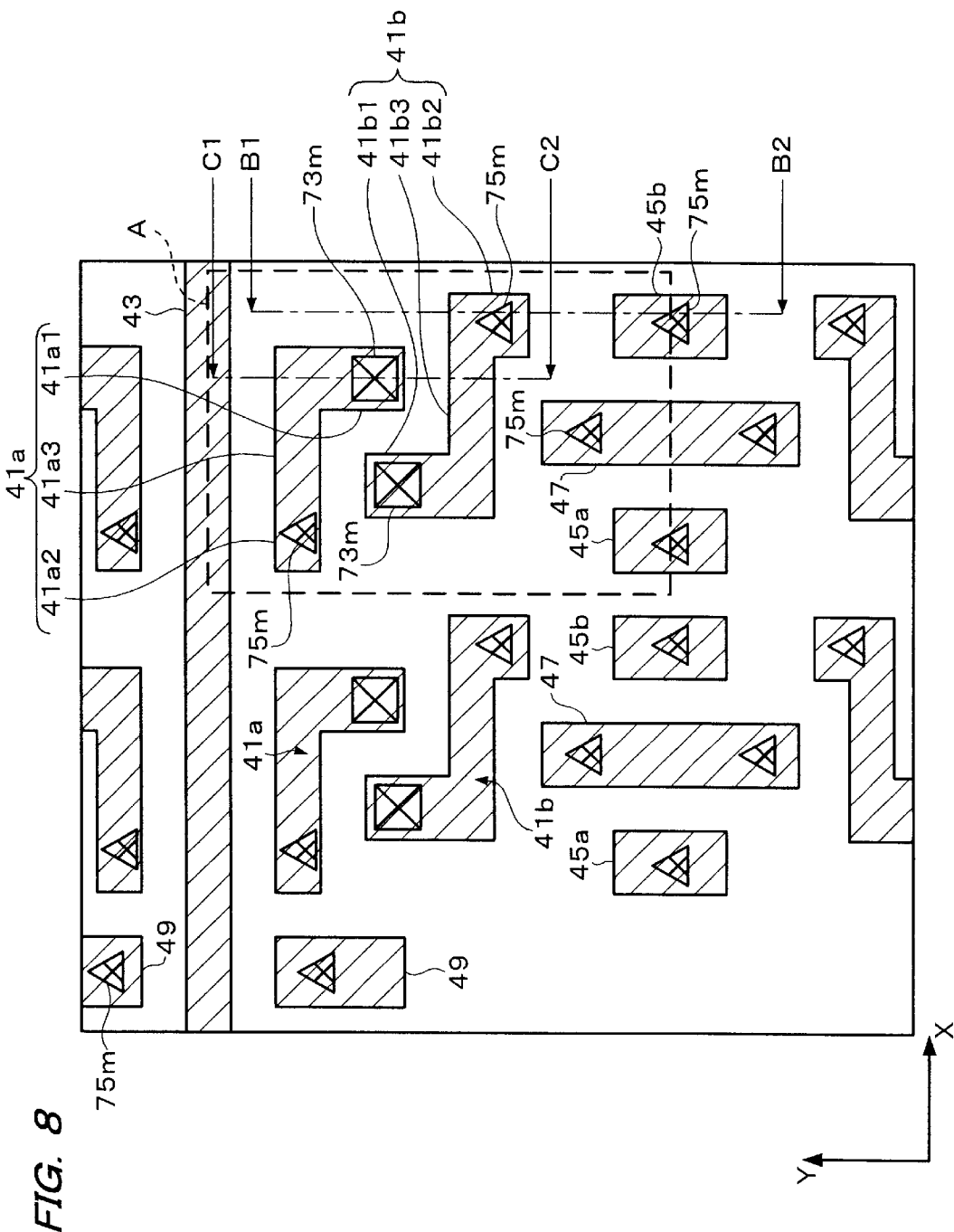
FIG. 8 is a plan view of a third conduction layer in a part of the memory cell array in accordance with one embodiment of the present invention.
Figure 9:
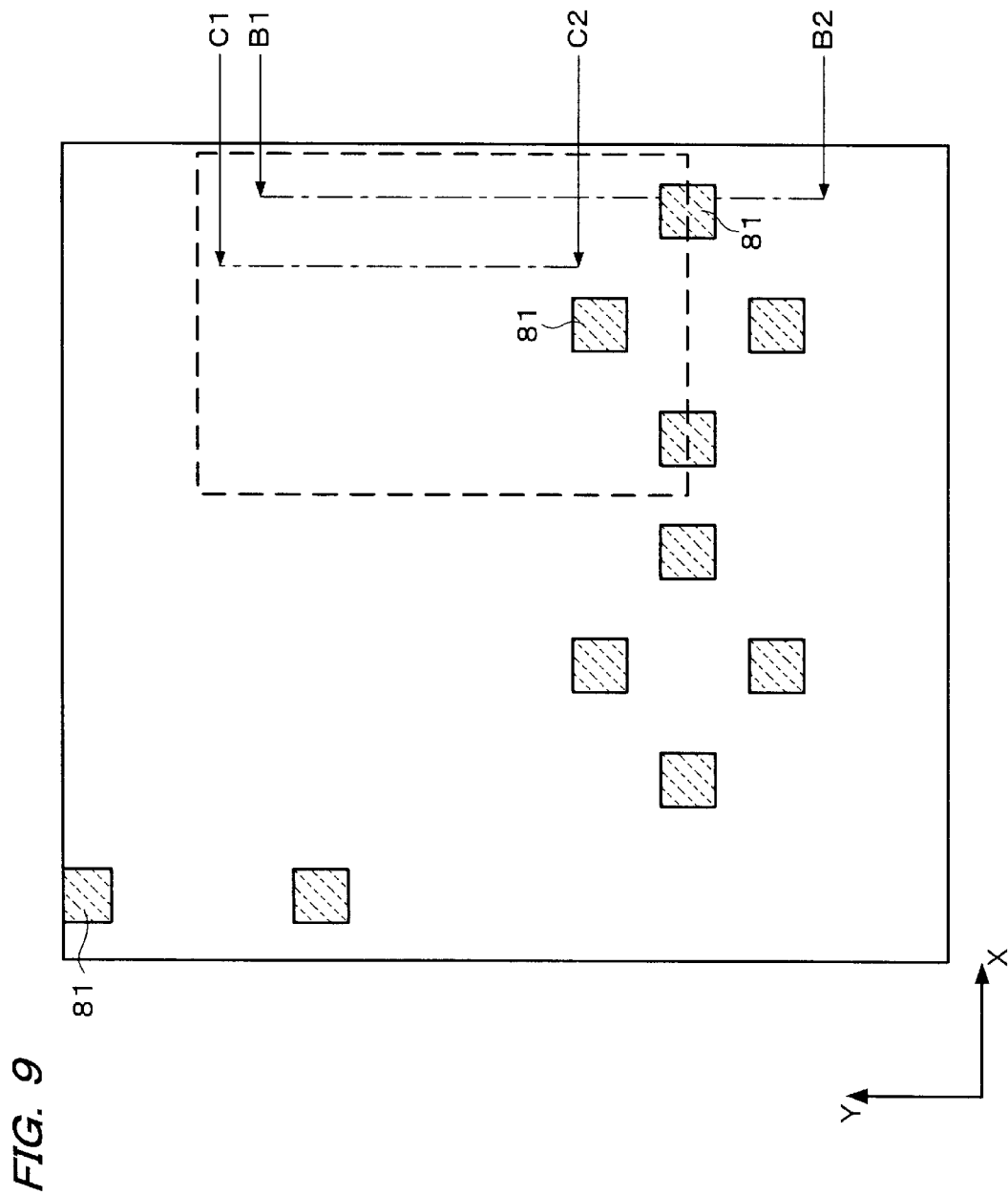
FIG. 9 is a plan view of a plug 81 in a part of the memory cell array in accordance with one embodiment of the present invention.

As shown in FIG. 3, gate electrode layers 21a and 21b and auxiliary word lines 23 are disposed in the first layer. As shown in FIG. 5, drain—drain connection layers 31a and 31b are disposed in the second layer. As shown in FIG. 8, drain-gate connection layers 41a and 41b are disposed in the third layer. A structure shown in FIG. 5 is located above the structure shown in FIG. 3, and a structure shown in FIG. 8 is located above the structure shown in FIG. 5. FIG. 1 shows these structures in one figure.

FIG. 1 shows a portion that forms a flip-flop. This is described focusing on a region A. The region A is a region where one memory cell is formed. The region A in the other figures has the same meaning.

Figure 16:
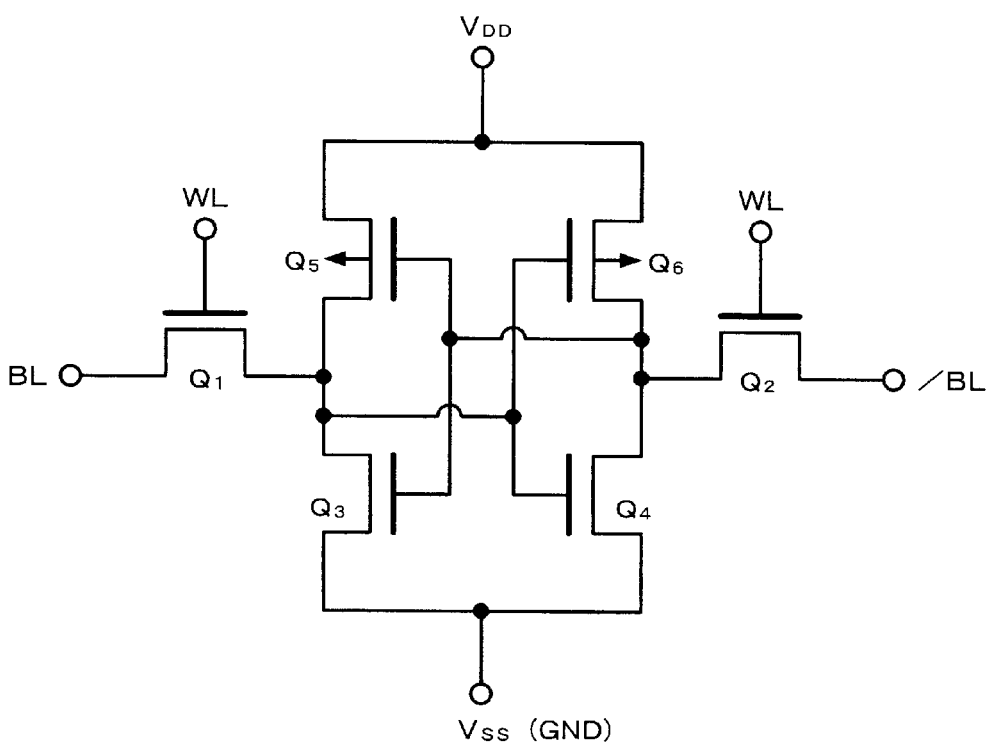
FIG. 16 is an equivalent circuit of an SRAM in accordance with one embodiment of the present invention.

In the region A, six MOS field effect transistors, namely, n-channel type transfer transistors $Q_1$ and $Q_2$, n-channel type driver transistors $Q_3$ and $Q_4$, and p-channel type load transistors $Q_5$ and $Q_6$ are formed. The driver transistor $Q_3$ and the load transistor $Q_5$ form one CMOS inverter. Also, the driver transistor $Q_4$ and the load transistor $Q_6$ form one CMOS inverter. These two CMOS inverters are cross-coupled to form a flip-flop. A circuit that is formed by the six MOS field effect transistors in Region A can be represented by an equivalent circuit shown in FIG. 16.

Referring to FIG. 1 again, the gate electrode layer 21a and the gate electrode layer 21b are formed in linear patterns, respectively. The gate electrode layer 21a forms gate electrodes of the driver transistor $Q_3$ and the load transistor $Q_5$, and also connects these electrodes to one another. Also, the gate electrode layer 21b forms gate electrodes of the driver transistor $Q_4$ and the load transistor $Q_6$, and further connects these electrodes to one another.

A drain region of the driver transistor $Q_3$ and a drain region of the load transistor $Q_5$ are connected by the drain—drain connection layer 31a. Also, a drain region of the driver transistor $Q_4$ and a drain region of the load transistor $Q_6$ are connected by the drain—drain connection layer 31b. The drain—drain connection layer 31a and the drain—drain connection layer 31b are in linear patterns, respectively.

Gate electrodes (the gate electrode layer 21a) of the driver transistor $Q_3$ and the load transistor $Q_5$ and the drain—drain connection layer 31b are connected by the drain-gate connection layer 41b. Also, gate electrodes (the gate electrode layer 21b) of the driver transistor $Q_4$ and the load transistor $Q_6$ and the drain—drain connection layer 31a are connected by the drain-gate connection layer 41a. The drain-gate connection layer 41a and the drain-gate connection layer 41b are in letter-L shape patterns, respectively. A first side and a second side of each of the L-letter patterns generally form an angle of 90 degrees. The first side of the drain-gate connection layer 41a is opposed to the first side of the drain-gate connection layer 41b. The second side of the drain-gate connection layer 41a is opposed to the second side of the drain-gate connection layer 41b. The drain-gate connection layer 41a and the drain-gate connection layer 41b are symmetrical about a point.

The gate electrode layer 21a, the gate electrode layer 21b, the drain—drain connection layer 31a and the drain—drain connection layer 31b are disposed in parallel with one another. When viewed in plan view, the gate electrode layers 21a and 21b are located between the drain—drain connection layer 31a and the drain—drain connection layer 31b.

Structure of Memory Cell

Figure 2:
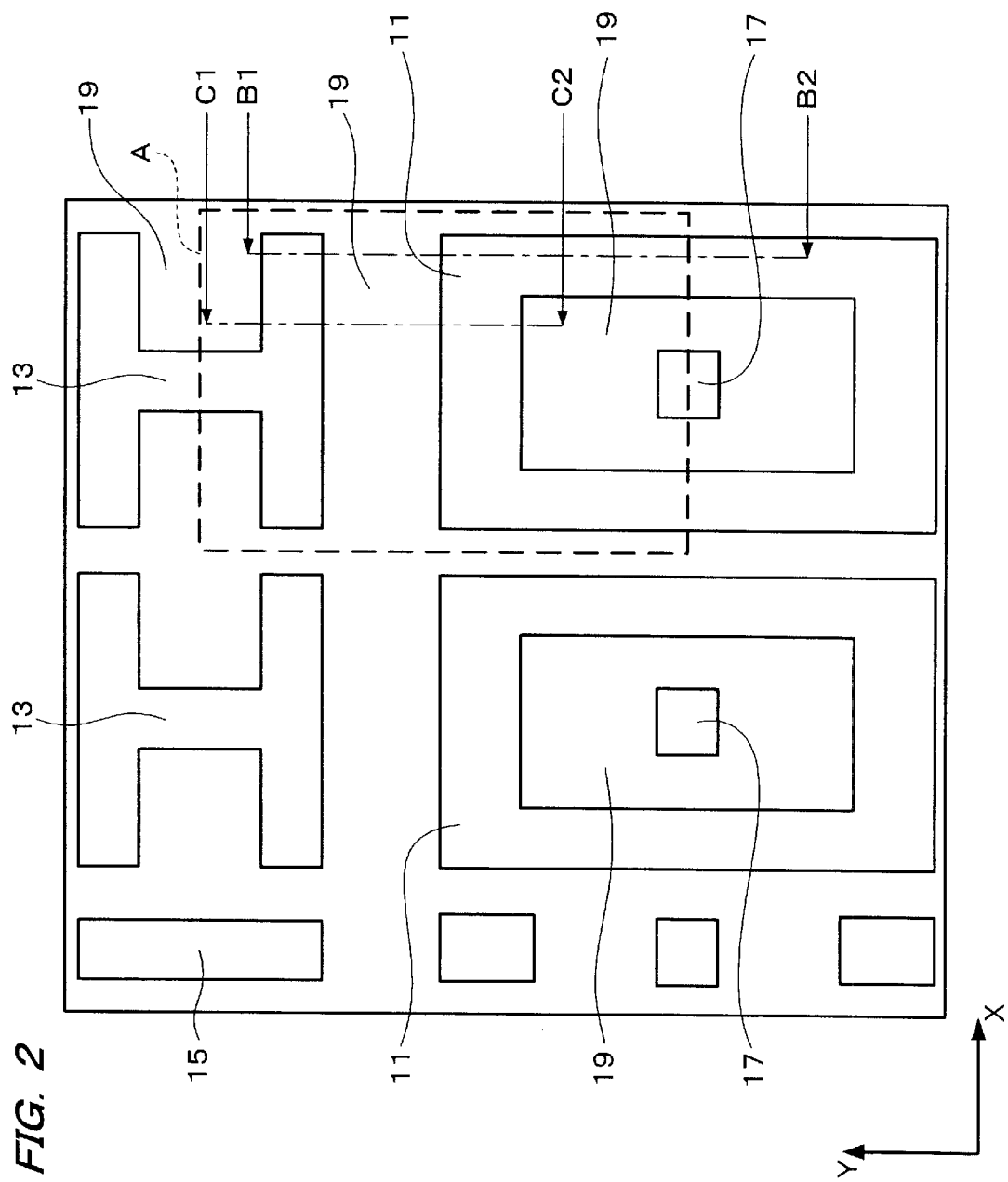
FIG. 2 is a plan view of a field in a part of the memory cell array in accordance with one embodiment of the present invention.
Figure 10:
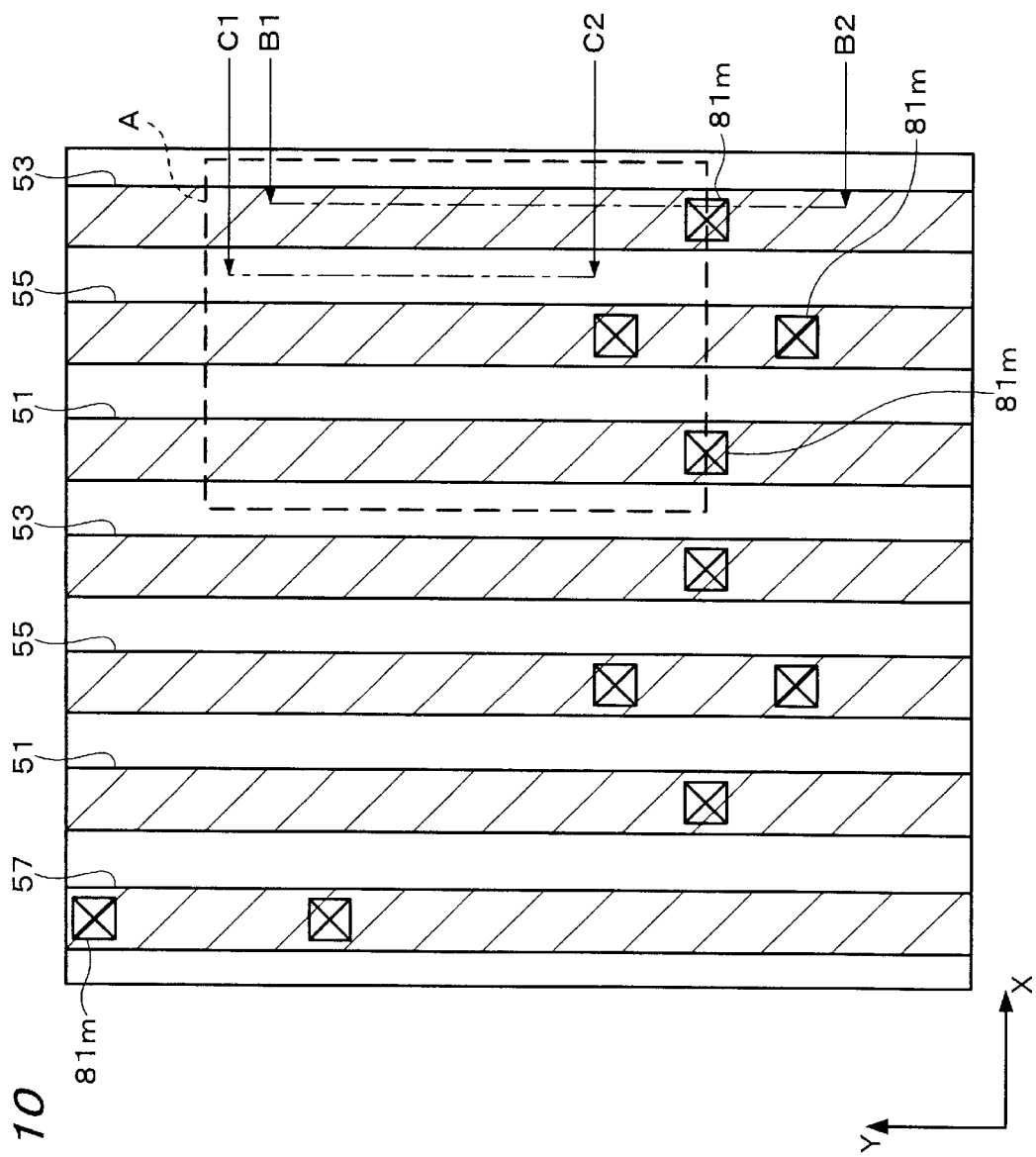
FIG. 10 is a plan view of a fourth conduction layer in a part of the memory cell array in accordance with one embodiment of the present invention.

Next, a structure of the memory cell in accordance with the present embodiment is described. The memory cell of the present embodiment has a structure in which first, second, third and fourth conduction layers are successively stacked in layers over a field with interlayer dielectric layers interposed between the layers. As shown in FIG. 2, the field is a region where active regions 11, 13, 15 and 17, and element isolation regions 19 are located. The fourth layer is a layer where bit lines 51 and the like are located, as shown in FIG. 10. The memory cell of the present embodiment has a structure in which the first, second and third conduction layers described above with reference to FIG. 1 are positioned over the field shown in FIG. 2, and the fourth conduction layer shown in FIG. 10 is positioned over these layers.

Detailed Structure of the Embodiment

Figure 12:
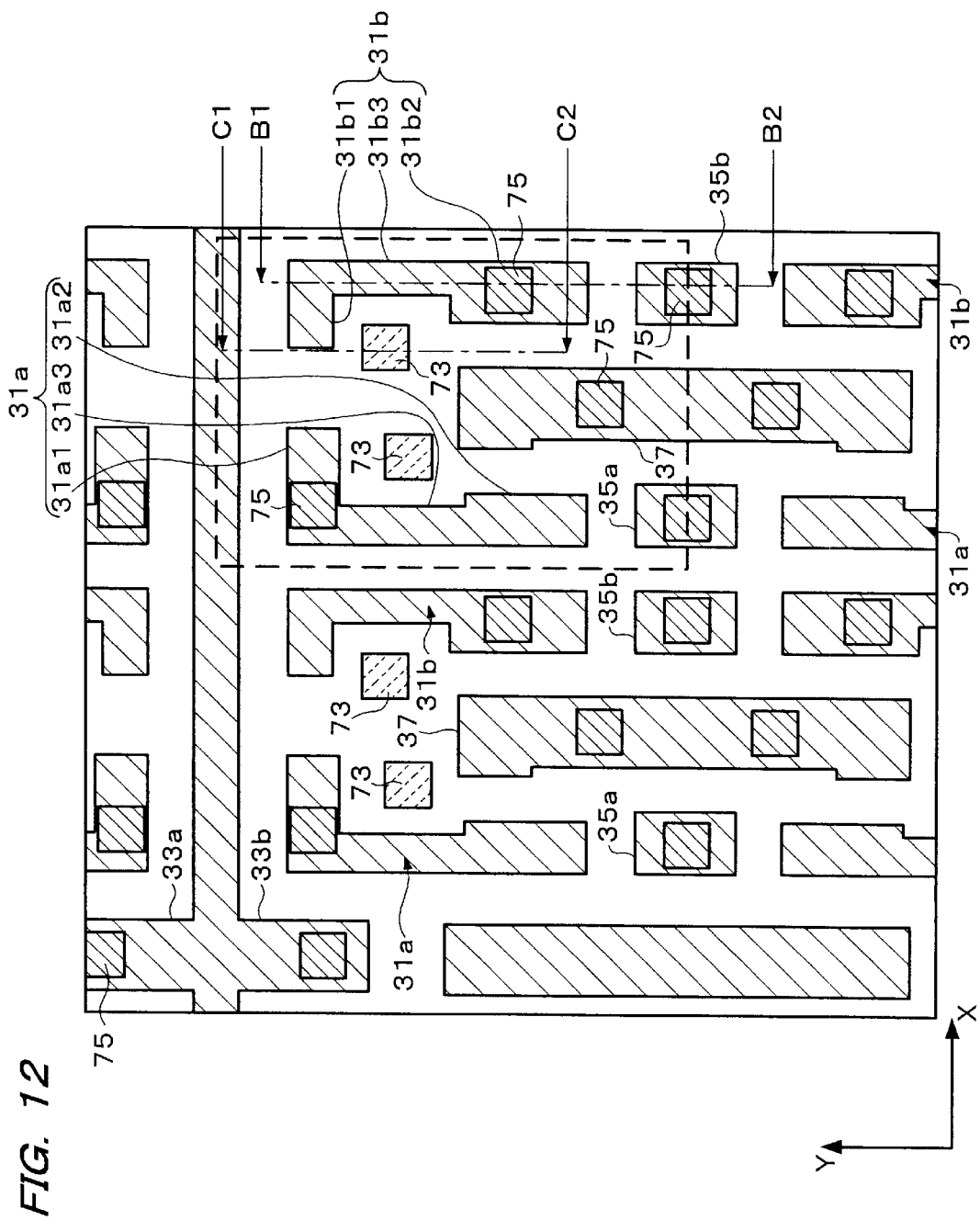
FIG. 12 is a plan view of the second layer and the plugs 73 and 75 in accordance with one embodiment of the present invention.
Figure 13:
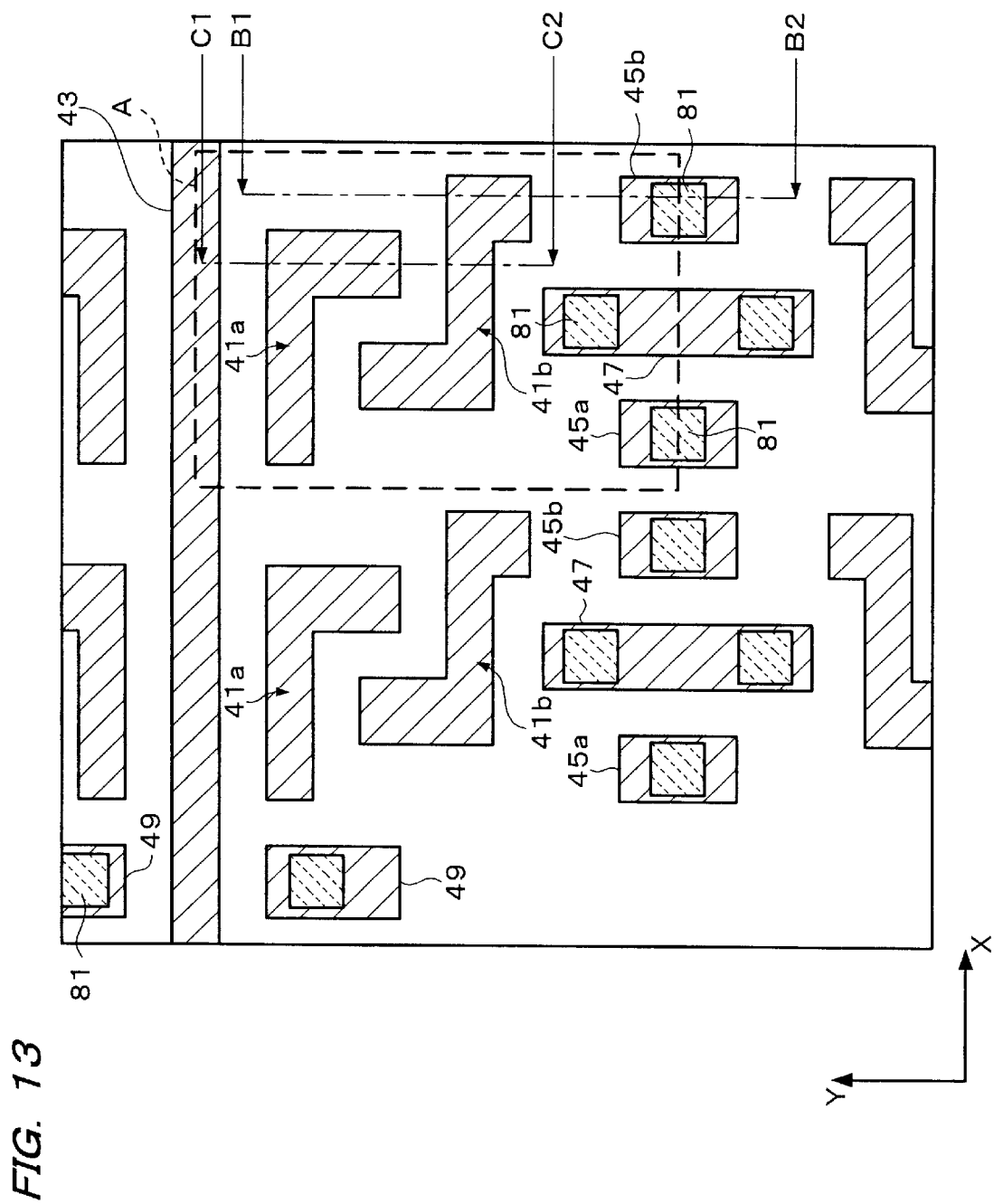
FIG. 13 is a plan view of the third layer and the plug 81 in accordance with one embodiment of the present invention.
Figure 14:
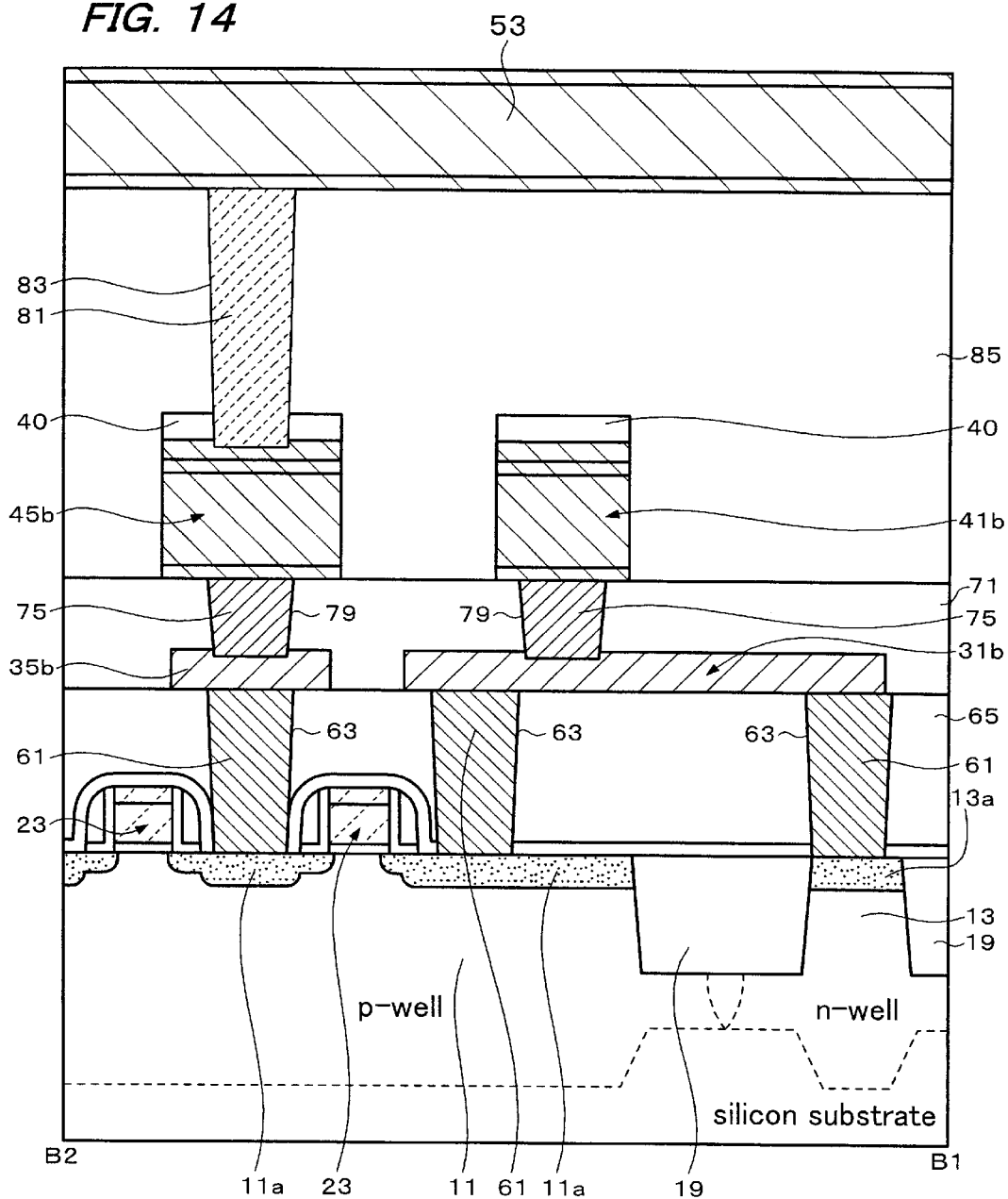
FIG. 14 is a cross-sectional view taken along lines B1–B2 shown in a plan view in accordance with one embodiment of the present invention.
Figure 15:
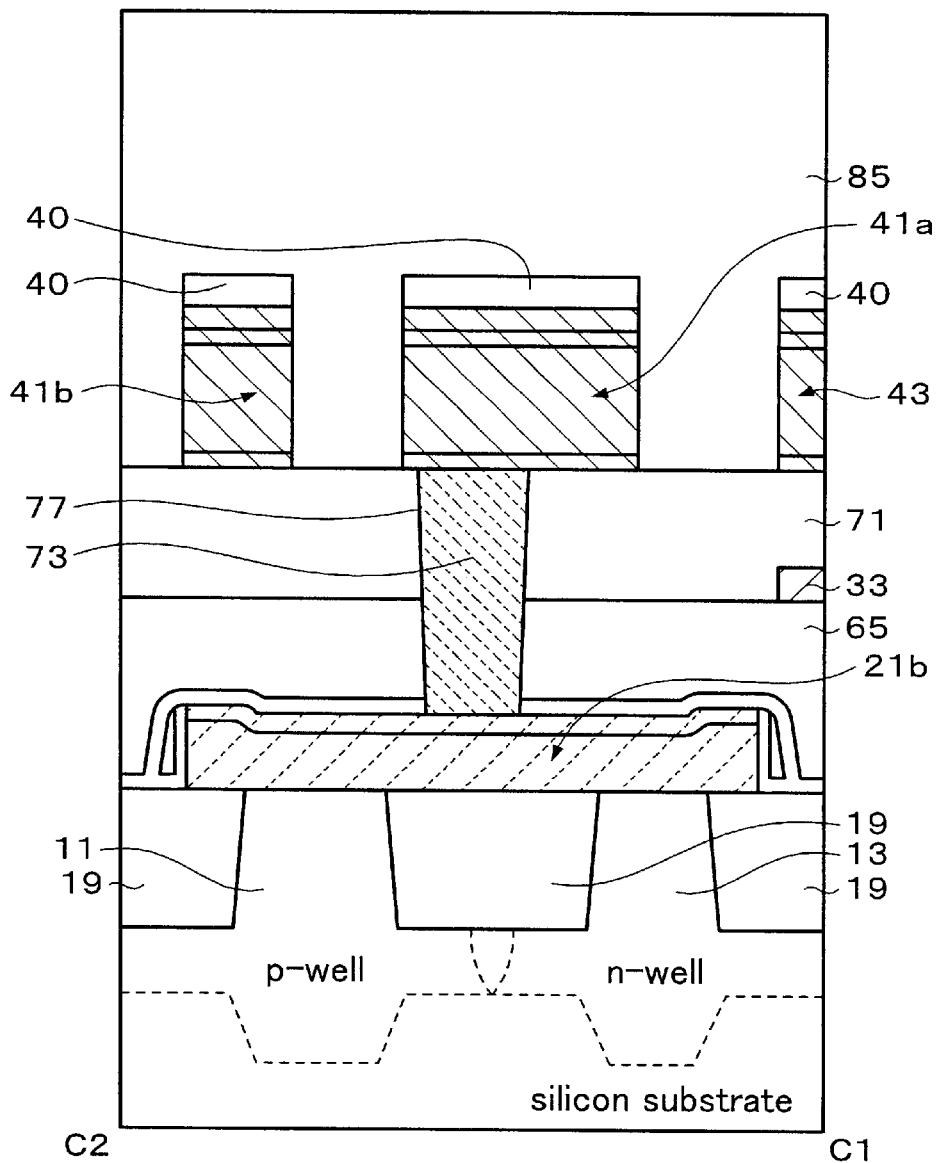
FIG. 15 is a cross-sectional view taken along lines C1–C2 shown in a plan view in accordance with one embodiment of the present invention.

The structure of the present embodiment is described in detail from the perspective of the bottom layer with reference to FIGS. 2–15. FIGS. 2—13 show plane B1–B2, and plane C1–C2. FIG. 14 is a cross-sectional view taken along the plane B1–B2, and FIG. 15 is a cross-sectional view taken along the plane C1–C2.

Field, First Layer

Figure 11:
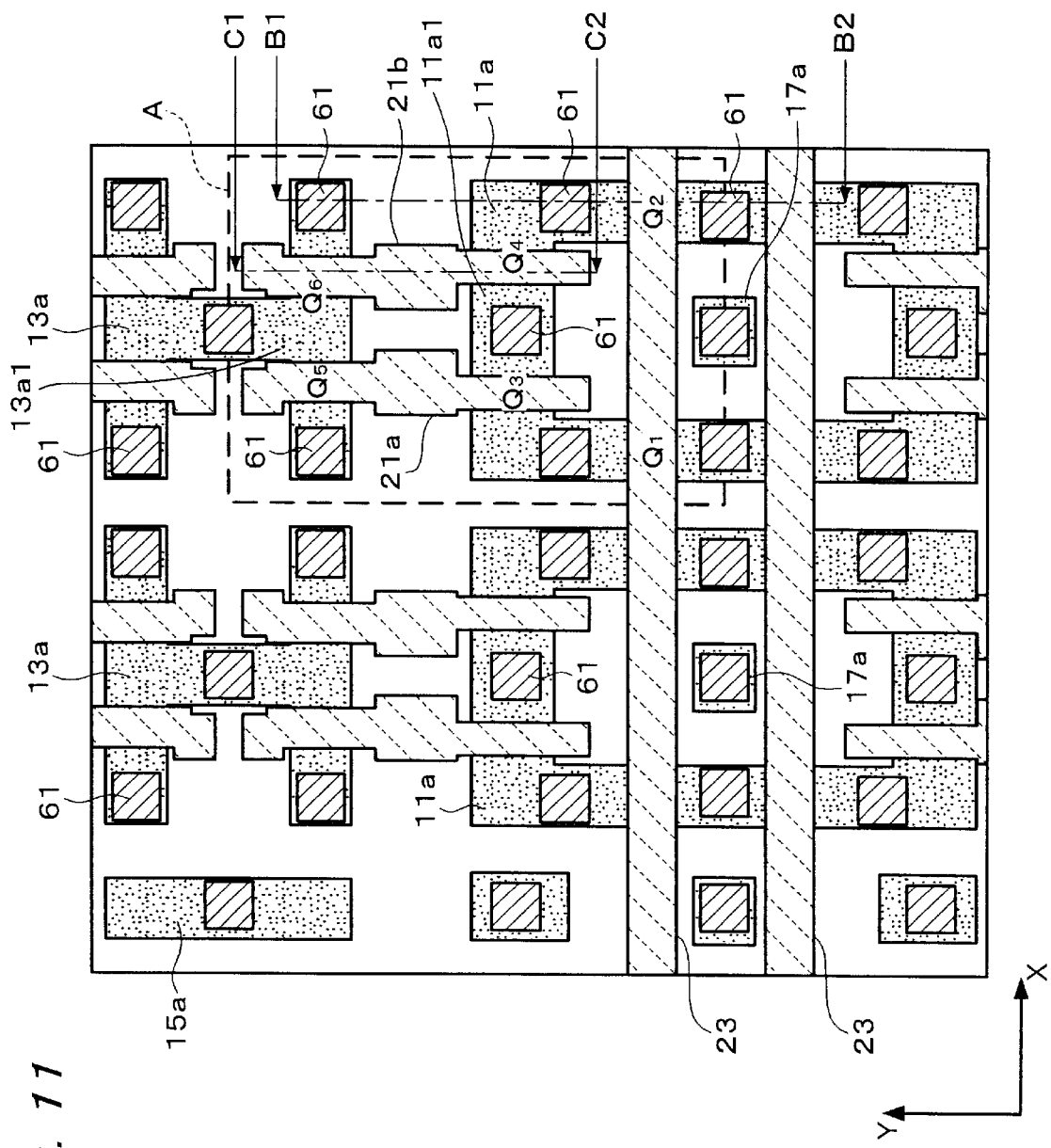
FIG. 11 is a plan view of the field, the first layer and the plug 61 in accordance with one embodiment of the present invention.

FIG. 11 is a plan view of the field and the first conduction layer. First, the field is described with reference to FIGS. 2, 14 and 15. FIG. 2 is a plan view of the field. The field includes active regions 11, 13, 15 and 17, and element isolation regions 19. The active regions 11, 13, 15 and 17 are formed on the surface of a silicon substrate.

The active region 11 has a generally rectangular frame shape. A plurality of the active regions 11 are arranged in the X-axis direction in FIG. 2. The transfer transistors $Q_1$ and $Q_2$ and the driver transistors $Q_3$ and $Q_4$ shown in FIG. 1 are formed in the active region 11. The active region 13 generally is in a letter-H shape. A plurality of the active regions 13 are arranged in the X-axis direction in FIG. 2. The load transistors $Q_5$ and $Q_6$ shown in FIG. 1 are formed in the active region 13. Each one of the active regions 15 is formed, for example, for every thirty-two (32) memory cells arranged in the X-axis direction. A well contact region for n-wells is formed in the active region 15. Each one of the active regions 17 is formed, for example, for every two memory cells arranged in the Y-axis direction. A well contact region for p-wells is formed in the active region 17.

The active regions 11, 13, 15 and 17 are isolated from other active regions by the element isolation regions 19 (having a depth of, for example, 400 nm). The element isolation regions 19 may be provided by, for example, STI (shallow trench isolation).

Cross-sectional views of the field shown in FIG. 2 taken along the plane B1–B2 and the plane C1–C2 are shown in FIG. 14 and FIG. 15, respectively.

The active regions 11 and 13 and the element isolation regions 19 appear in these cross sections.

Next, the first layer positioned on the field is described with reference to FIG. 3, FIG. 11, FIG. 14 and FIG. 15. FIG. 3 is a plan view of the first conduction layer. A plurality of gate electrode layers 21a and 21b and a plurality of auxiliary word lines 23 are disposed in the first layer. The gate electrode layers 21a and 21b and the auxiliary word lines 23 have a structure in which, for example, a silicide layer is formed on a polysilicon layer.

Each of the gate electrode layers 21a and 21b has a linear pattern extending in the Y-axis direction in FIG. 3. One pair of the gate electrode layers 21a and 21b is disposed in parallel with each other in each one of the memory cell regions. The gate electrode layers 21a and 21b become gate electrodes of the driver transistors $Q_3$ and $Q_4$ and the load transistors $Q_5$ and $Q_6$ shown in FIG. 1. The gate length of each of the driver transistors $Q_3$ and $Q_4$ is, for example, 0.18 μm, and the gate length of each of the load transistors $Q_5$ and $Q_6$ shown is, for example, 0.20 μm.

Each of the auxiliary word lines 23 has a linear pattern extending in the X-axis direction in FIG. 3. The auxiliary word lines 23 are located on the side of the driver transistors. The auxiliary word lines 23 are activated or inactivated by main word lines located in an upper layer. The auxiliary word lines 23 become gate electrodes of the transfer transistors. The gate length of each of transfer transistors is, for example, 0.24 μm.

Cross-sectional views of the first layer shown in FIG. 3 taken along the plane B1–B2 and the plane C1–C2 are shown in FIG. 14 and FIG. 15, respectively. The auxiliary word lines 23 and the gate electrode layers 21b appear in these cross-sectional views.

Next, source/drain regions and the like that are formed in the active regions are described. As shown in FIG. 11, $n^+$ type source/drain regions 11a are formed in the active regions 11. The "source/drain region" means a region that functions as at least one of a source and a drain. For example, the $n^+$ type source/drain region 11a located between the gate electrode layer 21a and the gate electrode layer 21b becomes a source region 11a1 of the driver transistors $Q_3$ and $Q_4$. The driver transistors $Q_3$ and $Q_4$ in one of memory cells do not commonly share a source region with the driver transistors $Q_3$ and $Q_4$ in another of the memory cells.

P$^+$ type source/drain regions 13a are formed in the active regions 13. Source regions of the load transistors $Q_5$ and $Q_6$ are p$^+$ type source regions 13a1. The load transistors $Q_5$ and $Q_6$ in one of the memory cells do not commonly share a source region with the load transistors $Q_5$ and $Q_6$ in an adjacent memory cell arranged in a direction in which the auxiliary word line 23 extends, but commonly share a source region with an adjacent memory cell (a memory cell shown above in FIG. 11) that is arranged in a direction in which the bit lines extend. N$^+$ type well contact regions 15a are formed in the active regions 15. N wells corresponding to the thirty-two memory cells are connected to a $V_{DD}$ wiring (power supply line) through the n$^+$ type well contact region 15a. P$^+$ type well contact regions 17a are formed in the active regions 17. P wells corresponding to the two memory cells are connected to a $V_{SS}$ wiring (grounding line) through the p$^+$ type well contact region 17a.

Figure 4:
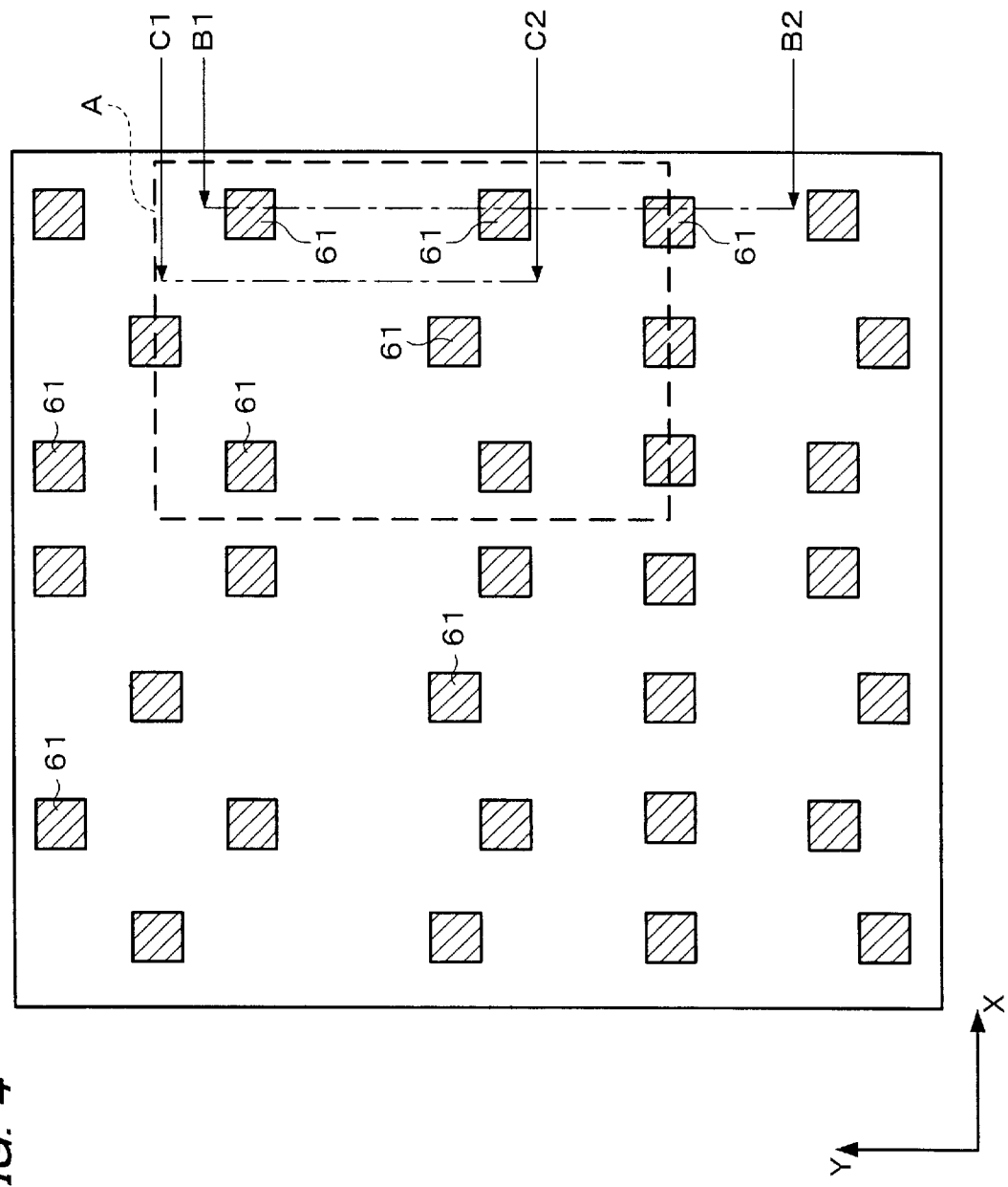
FIG. 4 is a plan view of a plug 61 in a part of the memory cell array in accordance with one embodiment of the present invention.

An interlayer dielectric layer, such as, for example, a silicon oxide layer (not shown in FIG. 11) is formed in a manner to cover the field and the first layer. As shown in FIG. 14 and FIG. 15, the interlayer dielectric layer 65 is processed by CMP for planarization. A plurality of contact holes 63 are formed in the interlayer dielectric layer 65, which expose the n$^+$ type source/drain regions 11a and the like. Plugs 61 are embedded in the contact holes 63. The plugs 61 are connected to the n$^+$ type source/drain regions 11a, the p$^+$ type source/drain regions 13a, the n$^+$ type well contact regions 15a, and the p$^+$ type well contact regions 17a. The plugs 61 have patterns as shown in FIG. 4 in plan view. Tungsten, for example, can be used as a material for the plugs 61. The diameter of the contact hole 63 at its upper end section is, for example, 0.30 µm, and at its lower end section is, for example, 0.24 µm.

Second Layer

The second layer is structurally located above the structure shown in FIG. 11. As shown in FIG. 5, a plurality of drain—drain connection layers 31a and 31b, $V_{DD}$ wiring 33, a plurality of BL (bit line) contact pad layers 35a and 35b, and a plurality of $V_{SS}$ local wirings 37 are disposed in the second conduction layer. They have a structure in which, for example, a titanium nitride layer (having a thickness of, for example, 135 nm) is formed on an underlying titanium layer (having a thickness of, for example, 8.5 nm).

The drain—drain connection layers 31a and 31b have linear patterns extending in the Y-axis direction, respectively, as shown in FIG. 5. A main body section 31a3 of the drain—drain connection layer 31a has a width smaller than a width of either of the end sections 31a1 and 31a2 of the drain—drain connection layer 31a. Similarly, a main body section 31b3 of the drain—drain connection layer 31b has a width smaller than a width of either of the end sections 31b1 and 31b2 of the drain—drain connection layer 31b. The width of each of the main body section 31a3 and the main body section 31b3 is a minimum value on the design rule. One set of the drain—drain connection layers 31a and 31b are disposed in every one memory cell region.

The $V_{SS}$ local wiring 37 has a linear pattern extending in the Y-axis direction in FIG. 5. The width of end sections of the $V_{SS}$ local wiring 37 is greater than a width of a main body section of the $V_{SS}$ local wiring 37. The $V_{SS}$ local wiring 37 is located between the end section 31a2 of the drain—drain connection layer 31a and the end section 31b2 of the drain—drain connection layer 31b. From this point, the $V_{SS}$ local wiring 37 extends to an area between the end section 31a2 of the drain—drain connection layer 31a and the end section 31b2 of the drain—drain connection layer 31b of a memory cell located therebelow in FIG. 5. Each one of the $V_{SS}$ local wirings 37 is disposed for every two of the memory cells.

The BL contact pad layer 35a functions as a pad layer to connect the bit line and the n$^+$ type source/drain region 11a (see FIG. 11). Similarly, the BL contact pad layer 35b functions as a pad layer to connect the bit line and the n$^+$ type source/drain region 11a.

The BL contact pad layer 35a is located between the drain—drain connection layer 31a of one memory cell and the drain—drain connection layer 31a of another memory cell located below in FIG. 5. Similarly, the BL contact pad layer 35b is located between the drain—drain connection layer 31b of one memory cell and the drain—drain connection layer 31b of another memory cell located therebelow in FIG. 5. Each one of the BL contact pad layers 35a and 35b is disposed for every two memory cells.

The $V_{DD}$ wiring 33 has a linear pattern extending in the X-axis direction in FIG. 5. The $V_{DD}$ wiring 33 extends three-dimensionally across the n$^+$ type well contact region 15a (see FIG. 11). The $V_{DD}$ wiring 33 has branch sections 33a and 33b above the n$^+$ type well contact region 15a.

The drain—drain connection layers 31a and 31b, the $V_{DD}$ wiring 33, the BL contact pad layers 35a and 35b, and the $V_{SS}$ local wirings 37 located in the second layer shown in FIG. 5 are connected to the plugs 61 shown in FIG. 11. These connected sections are shown in FIG. 5 as contact sections 61m.

FIG. 14 is a cross-sectional view of the second layer shown in FIG. 5 taken along the plane B1–B2. The drain—drain connection layer 31b and the BL contact pad layer 35b appear in the cross-sectional view.

An interlayer dielectric layer, such as, for example, a silicon oxide layer (not shown in FIG. 5) is formed in a manner to cover the second layer. As shown in FIG. 14 and FIG. 15, the interlayer dielectric layer 71 is processed by CMP for planarization. A plurality of through holes 79 are formed in the interlayer dielectric layer 71, which expose the drain—drain connection layer 31b and the like. Plugs 75 are embedded in the through holes 79. Also, as shown in FIG. 15, through holes 77 are formed in the interlayer dielectric layers 71 and 65, which expose the gate electrode layers 21b. Plugs 73 are embedded in the through holes 77. FIG. 12 is a plan view of the relationships between the plugs 73 and 75 and the second conduction layer.

Figure 6:
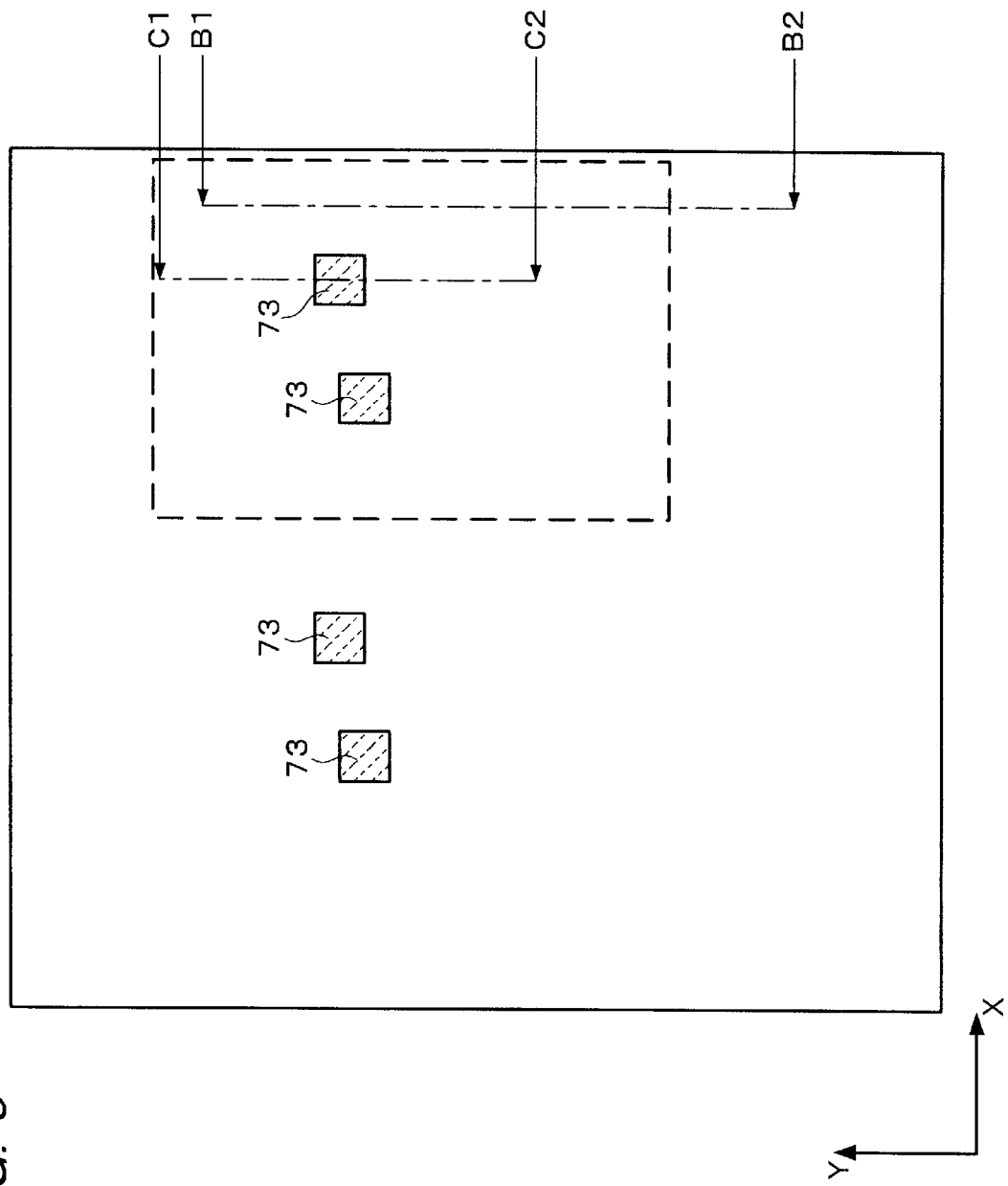
FIG. 6 is a plan view of a plug 73 in a part of the memory cell array in accordance with one embodiment of the present invention.

The plugs 73 are described below. The plugs 73 are disposed in plan view as shown in FIG. 6. The plugs 73 are connected to the gate electrode layers 21a and 21b (see FIG. 3). FIG. 15 is a cross-sectional view of the plug 73 and is described below. The plug 73 is embedded in the through hole 77 that passes through the two interlayer dielectric layers 65 and 71. The plug 73 is connected to the gate electrode layer 21b as shown in this cross-sectional view. Tungsten, for example, can be used as a material of the plugs 73. The diameter of the through hole 77 at its upper end section is, for example, 0.32 µm, and at its lower end section is, for example, 0.24 µm.

Figure 7:
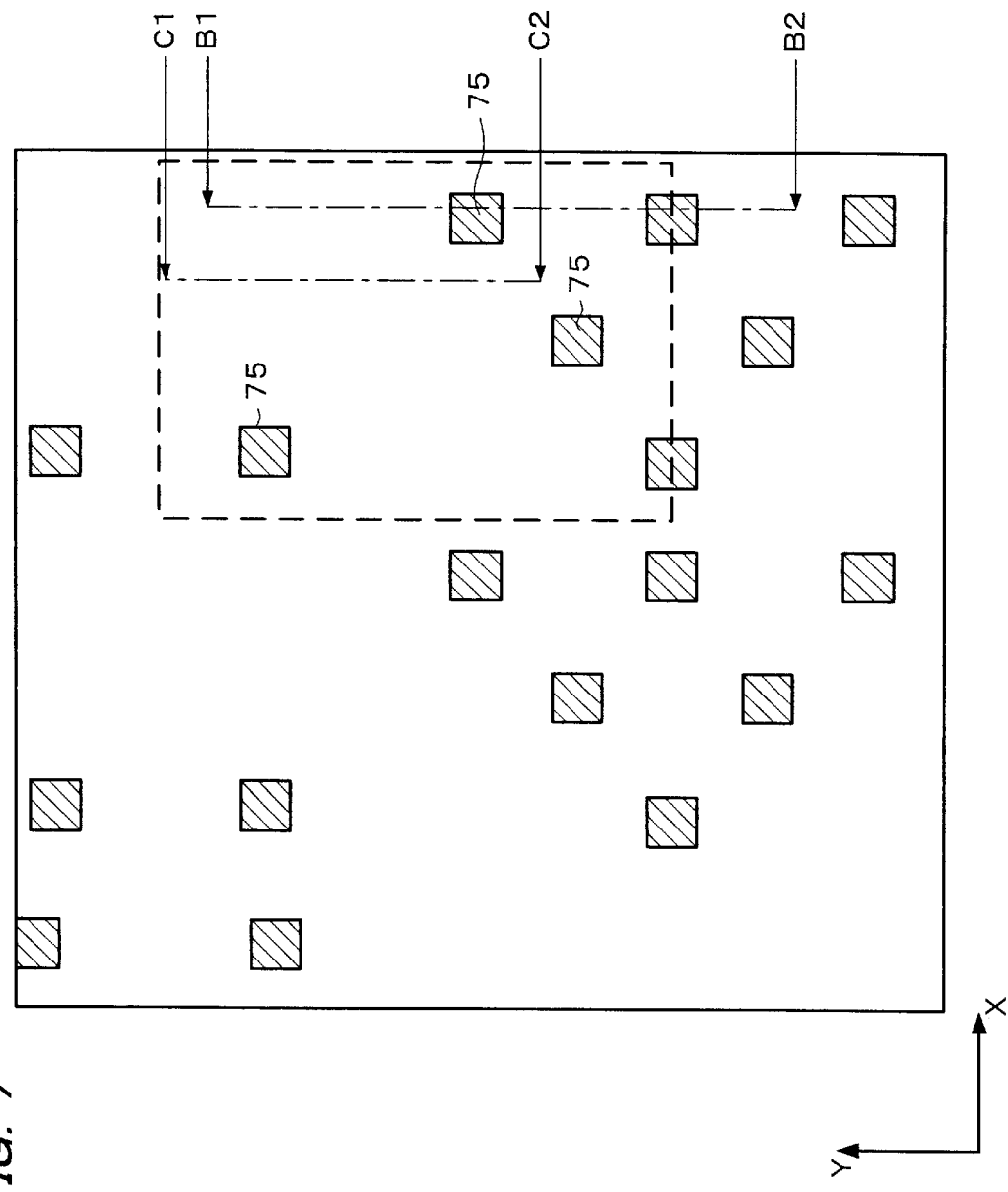
FIG. 7 is a plan view of a plug 75 in a part of the memory cell array in accordance with one embodiment of the present invention.

The plugs 75 are described below. The plugs 75 are disposed in plan view as shown in FIG. 7. The plugs 75 are connected to the drain—drain connection layers 31a and 31b, the branch sections 33a and 33b of the $V_{DD}$ wiring 33, the BL contact pad layers 35a and 35b, and the $V_{SS}$ local wirings 37. FIG. 14 is a cross-sectional view of the plug 75 and is described below. The plug 75 is embedded in the through hole 79 that passes through the interlayer dielectric layer 71. The plug 75 is connected to the drain—drain connection layer 31b and the BL contact pad layer 35b as shown in this cross-sectional view. Tungsten, for example, can be used as a material of the plugs 75. The diameter of the through hole 79 at its upper end section is, for example, 0.30 μm, and at its lower end section is, for example, 0.24 μm.

Third Layer

The third layer is structurally located above the structure shown in FIG. 12. As shown in FIG. 8, a plurality of drain-gate connection layers 41a and 41b, main word lines 43, a plurality of BL contact pad layers 45a and 45b, a plurality of $V_{SS}$ contact pad layers 47, and a plurality of $V_{DD}$ contact pad layers 49 are disposed in the third conduction layer. They have a structure in which, for example, from the bottom layer, a titanium nitride layer, an aluminum-copper alloy layer, a titanium layer and a titanium nitride layer are successively stacked in layers.

The drain-gate connection layer 41a has a main body section 41a3 and two end sections 41a1 and 41a2. The main body section 41a3 is a section that extends in the X-axis direction in FIG. 8. The end section 41a1 is a section that bends toward the side of the drain-gate connection layer 41b. Similarly, the drain-gate connection layer 41b has a main body section 41b3 and two end sections 41b1 and 41b2. The main body section 41b3 is a section that extends in the X-axis direction in FIG. 8. The end section 41b1 is a section that bends toward the side of the drain-gate connection layer 41a. One set of the drain-gate connection layers 41a and 41b are disposed in each one of the memory cell regions.

The BL contact pad layer 45a functions as a pad layer to connect the bit line and the $n^+$ type source/drain region 11a. Similarly, the BL contact pad layer 45b functions as a pad layer to connect the bit line and the $n^+$ type source/drain region 11a. Each of the BL contact pad layers 45a and 45b is disposed for every two memory cells.

The $V_{SS}$ contact pad layer 47 extends in the Y-axis direction in FIG. 8 and has two end sections. The $V_{SS}$ contact pad layer 47 is located between the BL contact pad layer 45a and the BL contact pad layer 45b. Each one of the $V_{SS}$ contact pad layers 47 is disposed for every two of the memory cells.

The main word line 43 linearly extends in the X-axis direction in FIG. 8. The main word line 43 is located above the $V_{DD}$ wiring 33 shown in FIG. 5. The $V_{DD}$ contact pad layers 49 are located above the branch sections 33a and 33b of the $V_{DD}$ wiring 33 shown in FIG. 5.

The end section 41a 1 of the drain-gate connection layer 41a and the end section 41b 1 of the drain-gate connection layer 41b are connected to the plugs 73 shown in FIG. 12, respectively. These connected sections are shown in FIG. 8 as contact sections 73m. The end section 41a2 of the drain-gate connection layer 41a, the end section 41b2 of the drain-gate connection layer 41b, the BL contact pad layers 45a and 45b, the $V_{SS}$ contact pad layer 47 and the $V_{DD}$ contact pad layer 49 are connected to the plugs 75 shown in FIG. 12. These connected sections are shown in FIG. 8 as contact sections 75m.

FIGS. 14 and 15 are cross-sectional views of the third layer shown in FIG. 3 taken along plane B1–B2 and plane C1–C2, respectively. The drain-gate connection layers 41a and 41b, the BL contact pad layer 45b and the main word line 43 appear in these cross-sectional views. A hard mask layer 40 formed of a silicon oxide layer is formed on the third conduction layer including these layers. The third conduction layer is patterned using the hard mask layer 40. This is performed because it is difficult to pattern the third conduction layer using only a resist as a mask due to the miniaturized memory cell.

An interlayer dielectric layer, such as, for example, a silicon oxide layer is formed in a manner to cover the third layer. As shown in FIG. 14 and FIG. 15, the interlayer dielectric layer 85 is processed by CMP for planarization. A plurality of through holes 83 are formed in the interlayer dielectric layer 85, which expose the BL contact pad layers 45a and the like. Plugs 81 are embedded in the through holes 83. They are shown in a plan view in FIG. 13. As shown in FIG. 13, the plugs 81 are connected to the BL contact pad layers 45a and 45b, the $V_{SS}$ contact pad layer 47 and $V_{DD}$ contact pad layer 49. The plugs 81 have patterns shown in plan view of FIG. 9. Tungsten, for example, can be used as a material for the plugs 81. The diameter of the through hole 83 at its upper end section is, for example, 0.36 μm, and at its lower end section is, for example, 0.28 μm.

Fouth Layer

The fourth layer is structurally located above the structure shown in FIG. 13. As shown in FIG. 10, a plurality of bit lines 51, a plurality of bit lines 53, a plurality of $V_{SS}$ wirings 55 and the $V_{DD}$ wirings 57 are disposed in the fourth layer. The $V_{SS}$ wiring 55 is located between the bit line 51 and the bit line 53, as viewed in the X-axis direction, and disposed in a center of the memory cell. Each one of the $V_{DD}$ wirings 57 is disposed for, for example, every thirty-two (32 ) memory cells arranged in the X-axis direction. They linearly extend in the Y-axis direction in FIG. 10. They are connected to the plugs 81 shown in FIG. 13, respectively. The connected sections are shown in FIG. 10 as contact sections 81m. The bit lines 51 have a structure in which, for example, from the bottom layer, a titanium nitride layer, an aluminum-copper alloy layer, and a titanium nitride layer are successively stacked in layers.

FIG. 14 is a cross-sectional view of the fourth layer shown in FIG. 10 taken along plane B1–B2. The bit line 53 appears in the cross-sectional view. A signal that is complementary to the signal flown through the bit line 51 flows through the bit line 53.

The above is a detailed structure of the embodiment of the present invention. It is noted that the patterns shown in FIGS. 1 through 13 are designed patterns. These patterns have corner sections. However, in patterns that are actually formed on a semiconductor substrate, lines that define the corner sections are curved due to the light proximity effect.

Advantages of the Present Embodiment

Advantages of the present embodiment are described below.

{1} In accordance with the present embodiment, the size of an SRAM can be reduced because of the following reasons. In accordance with the present embodiment, data is stored by the flip-flops of the memory cells. A flip-flop is formed by connecting an input terminal (a gate electrode) of one inverter to an output terminal (a drain) of the other inverter, and connecting an input terminal (a gate electrode) of the other inverter to an output terminal (a drain) of the one inverter. In other words, a flip-flop cross-couples a first inverter and a second inverter. Therefore, when a flip-flop is formed with two layers, for example, drain—drain connection layers that connect drains of inverters, and drain-gate connection layers that connect gates of the inverters to the drains of the inverters, may be formed in one conduction layer to allow cross-couple connections.

However, in the structure described above, the conduction layer is formed extending across a region where the drains of one inverter are located, a region where the gates of the other inverter are located and a region that connects these regions. The conduction layer may present a pattern having three end sections (for example, a pattern having branch sections such as a T-letter shape or an h-letter shape) or spiral patterns with their arm sections intertwined. For example, patterns having a T-letter shape are described in FIG. 1 of Japanese Patent Application Laid-Open No. 10-41409 . Patterns having an h-letter shape are described, for example, in FIG. 4(b) on page 203 of *IEDM Tech. Digest*(1998 ) by Ishida, et al. Patterns having a spiral shape are described in FIG. 3(b) on page 203 of *IEDM Tech. Digest* (1998 ) by Ishida, et al. Such complicated patterns are difficult to accurately reproduce required shapes in the photo-etching process as the patterns are miniaturized, and cannot provide the required patterns and therefore become a hindrance to an attempt to reduce the memory cell size.

In accordance with the present embodiment, as shown in FIG. 1, gate electrode layers (21a and 21b) that define gates of CMOS inverters, drain—drain connection layers (31a and 31b) that connect drains of the CMOS inverters, and drain-gate connection layers (41a and 41b) that connect gates of one of the CMOS inverters and the drains of the other of the CMOS inverters are formed in different layers, respectively. Therefore, three layers are used to form a flip-flop. As a result, patterns in each layer can be simplified (for example, into linear shapes) compared to the case in which two layers are used to form a flip-flop. In this manner, in accordance with the present invention, since patterns in each layer can be simplified, for example, a miniaturized SRAM having a memory cell size of 4.5 $\mu m^2$ can be manufactured in the 0.18 $\mu m$ process generation.

Figure 17:
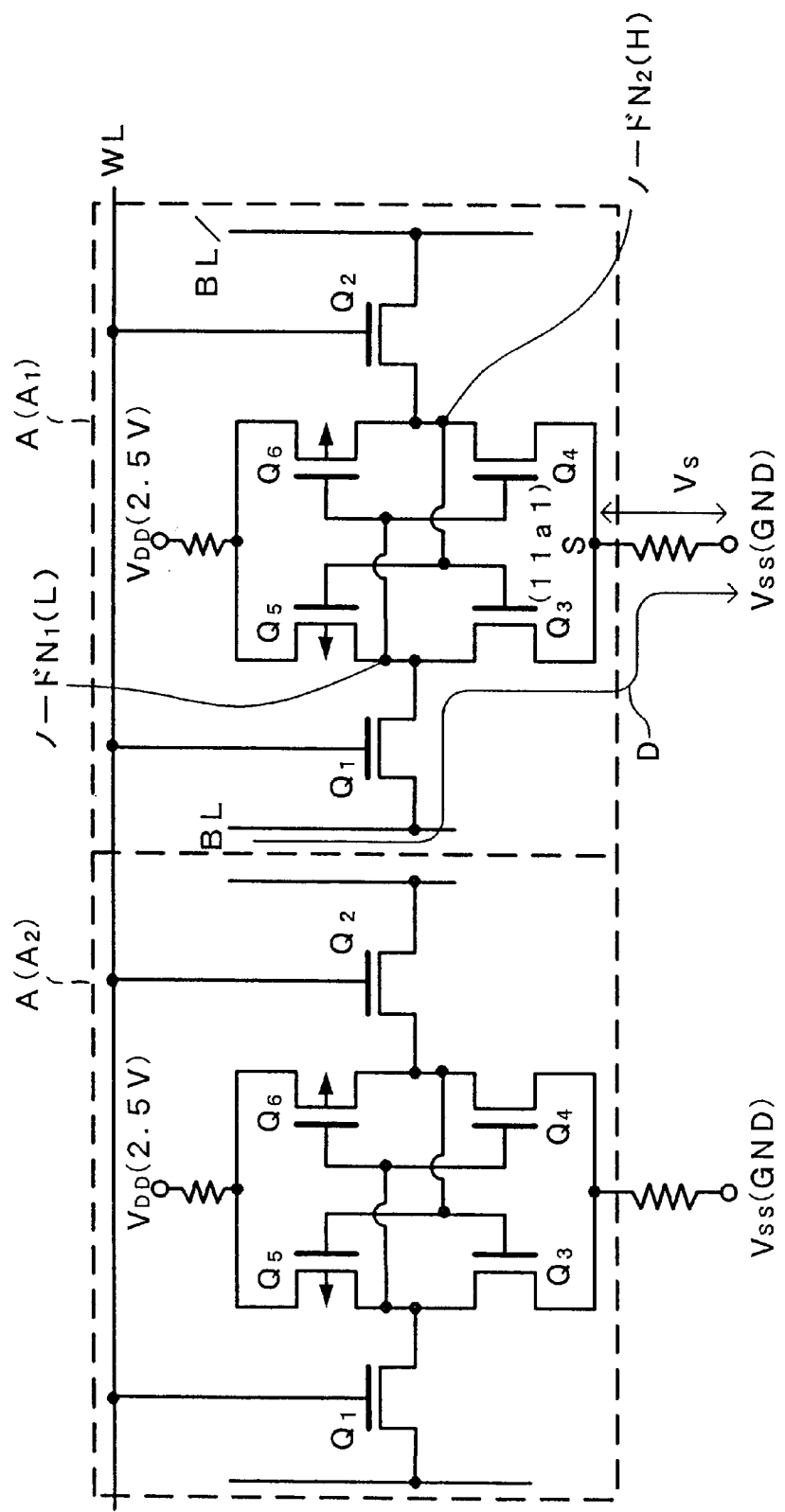
FIG. 17 is an equivalent circuit for two memory cells in accordance with one embodiment of the present invention.

{2} In accordance with the present embodiment, malfunctions of an SRAM can be prevented for the following reasons. FIG. 17 shows an equivalent circuit diagram of two memory cells in accordance with the present embodiment. One of the regions A is defined as a region $A_1$ and the other of the regions A is defined as a region $A_2$. The region $A_1$ and the region $A_2$ define memory cells that are disposed next to each other in a direction of a word line WL, and connected to a common auxiliary word line. Each of the memory cells defined by the region $A_1$ and the region $A_2$ has a flip-flop that is formed from driver transistors $Q_3$ and $Q_4$ and load transistors $Q_5$ and $Q_6$. The flip-flop stabilizes in a state when a node $N_1$ is at 'L' (at a relatively low potential) and a node $N_2$ is at 'H' (at a relatively high potential). Also, the flip-flop stabilizes in a state when the node $N_1$ is at 'H' (at a relatively high potential) and the node $N_2$ is at 'L' (at a relatively low potential). The flip-flop stores data by these two stabilized states. A potential difference between 'H' and 'L' between the nodes is called an operation margin. The smaller the operation margin, the more the SRAM would likely malfunction.

Cell current is one of the reasons that the operation margin is reduced. The following description and FIG. 17 are provided assuming that the flip-flop in the region $A_1$ has the node $N_1$ being at 'L' (at a relatively low potential) and the node $N_2$ is at 'H' (at a relatively high potential). When data stored in the flip-flop in the region $A_1$ is read out, a power supply voltage $V_{DD}$ (for example, 2.5 V) is applied to the word line WL, such that the bit line BL and the bit line BL are pre-charged (reset) at the power supply voltage $V_{DD}$. Since the node $N_2$ is at a high potential, the driver transistor $Q_3$ becomes conductive, such that current indicated by an arrow D flows from the bit line BL to the grounding (GND). This current is called cell current. Due to the cell current, the voltage at the source section resistance (parasitic resistance) of the driver transistor lowers, with the result that the potential at a source terminal S rises by a voltage $V_S$. As a result, a gate-source voltage $V_{GS}$ of the driver transistor $Q_3$ is reduced by the voltage $V_S$, which reduces the difference with the threshold voltage $V_{th}$ of the driver transistor, such that the cell current is reduced. As a result, the operation margin $V_{DD}$ changes to $V_{DD}$–$V_S$, and thus the operation margin becomes smaller.

Figure 18:
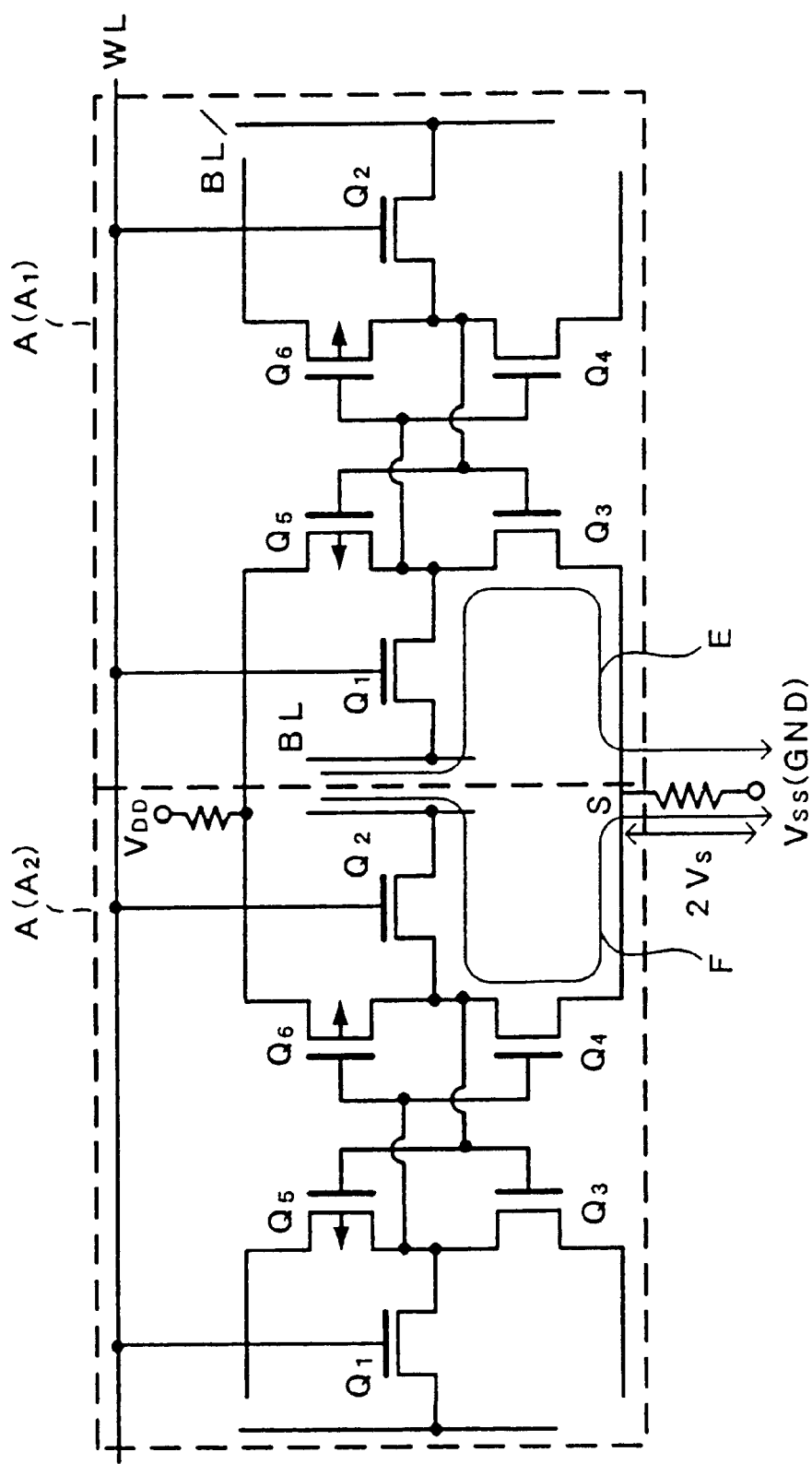
FIG. 18 is an equivalent circuit for two memory cells of an SRAM described in Japanese Patent Application Laid-Open No. 9-260510.

FIG. 18 shows an equivalent circuit of two memory cells of an SRAM described in Japanese Patent Application Laid-Open No. 9-260510. In this structure, the driver transistor $Q_3$ of the memory cell located in the region $A_1$ commonly shares the source region S with the driver transistor $Q_4$ of the memory cell located in the region $A_2$. As a result, when cell current indicated by an arrow E flows in the memory cell located in the region $A_1$, and cell current indicated by an arrow F flows in the memory cell located in the region $A_2$, the source terminal S has a potential of 2 $V_S$, with the result that the operation margin becomes to be $V_{DD}$–2$V_S$. In other words, in FIG. 18, current for the two memory cells flows through the source section resistance of the driver transistors, and therefore the voltage fall accordingly becomes greater to that extent.

In contrast, in accordance with the present embodiment shown in FIG. 17, the driver transistors $Q_3$ and $Q_4$ of the memory cell located in the region $A_1$ and the driver transistors $Q_3$ and $Q_4$ of the memory cell located in the region $A_2$ do not commonly share the source region S (the source region S is the $n^+$ type source region 11a1 shown in FIG. 11). As a result, in any combinations of the node data, current only for one memory cell flows in one memory cell. Therefore, in accordance with the present embodiment, the degree in the reduction of the operation margin can be reduced, and therefore malfunctions of the SRAM can be prevented.

It is noted that, in accordance with the present embodiment, as shown in FIG. 11, the load transistors $Q_5$ and $Q_6$ of one memory cell do not commonly share the $p^+$ type source region with the load transistors $Q_5$ and $Q_6$ of another memory cell arranged adjacent thereto in the direction of the word line. On the other hand, they commonly share the $p^+$ type source region with the load transistors $Q_5$ and $Q_6$ of another memory cell arranged adjacent thereto in the direction of the bit line. In accordance with this embodiment, the operation margin during a write operation is enhanced, and at the same time, the size reduction of the memory cell can also be realized. At write operations, operation current flows in the load transistors when one of the nodes is charged from 'L' to 'H'. In the present embodiment, the adjacent cells arranged in the word line direction do not commonly share the $p^+$ type source region, and therefore current only for one memory cell flows in the source section parasitic resistance of the load transistors. Also, although the adjacent cells arranged in the bit line direction commonly share the $p^+$ type source region, operation current of the load transistors is generated only when a word line is selected, and two word lines are not selected. Therefore, under any circumstances, current for two memory cells does not flow in the source section of the load transistors of the present embodiment. On the other hand, in the equivalent circuit shown in FIG. 18, under some combinations of data, current for two memory cells may flow, in the same manner as the driver transistors described above. Therefore, in accordance with the present embodiment, the operation margin can be enhanced. Also, by commonly sharing the $p^+$ type source region by adjacent cells arranged in the bit line direction, their contact plugs 61 (FIG. 4) for the source regions of the load transistors can be unified, and the $V_{DD}$ wiring 33 (FIG. 5) can be formed in a linear pattern. As a result, miniaturization of memory cells can be realized.

What is claimed is:

1. A semiconductor memory device, comprising:
   a plurality of memory cells, each of the memory cells including a first driver transistor, a second driver transistor, a first load transistor, a second load transistor, a first transfer transistor and a second transfer transistor, the memory cells further including first and second gate electrode layers, first and second drain—drain connection layers and first and second drain-gate connection layers,
   wherein the first gate electrode layer includes gate electrodes of the first driver transistor and the first load transistor,
   the second gate electrode layer includes gate electrodes of the second driver transistor and the second load transistor,
   the first drain—drain connection layer connects a drain region of the first driver transistor and a drain region of the first load transistor,
   the second drain—drain connection layer connects a drain region of the second driver transistor and a drain region of the second load transistor,
   the first drain-gate connection layer connects the first drain—drain connection layer and the second gate electrode layer,
   the second drain-gate connection layer connects the second drain—drain connection layer and the first gate electrode layer,
   the drain—drain connection layers, the drain-gate connection layers and the gate electrode layers are provided in different layers,
   in plan view, the first and second gate electrode layers are positioned between the first drain—drain connection layer and the second drain—drain connection layer, and
   the driver transistors of one of the memory cells do not commonly share a source region of the driver transistor of another of the memory cells.

2. The semiconductor memory device according to claim 1, wherein, in one of the memory cells, the first driver transistor commonly shares a source region of the second driver transistor.

3. The semiconductor memory device according to claim 1, wherein, in one of the memory cells, a source region of the first and second driver transistors is located between the first gate electrode layer and the second gate electrode layer.

4. The semiconductor memory device according to claim 1, further comprising an auxiliary word line, wherein
   the load transistors in one of the memory cells are arranged adjacent to each other in a direction in which the auxiliary word line extends, and do not commonly share a source region of the load transistors of another of the memory cells.

5. The semiconductor memory device according to claim 1, wherein
   the first and second driver transistors are n-type,
   the first and second load transistors are p-type, and
   the first and second transfer transistors are n-type,
   and further comprising first, second, third and fourth conduction layers,
   wherein
   the first gate electrode layer, the second gate electrode layer and an auxiliary word line are located in the first conduction layer,
   the first drain—drain connection layer, the second drain—drain connection layer, a power supply line, a first contact pad layer, a second contact pad layer and a third contact pad layer are located in the second conduction layer,
   the first drain-gate connection layer, the second drain-gate connection layer, a main word line, a fourth contact pad layer, a fifth contact pad layer and a sixth contact pad layer are located in the third conduction layer,
   a first bit line, a second bit line and a grounding line are located in the fourth conduction layer,
   the auxiliary word line extends in a first direction,
   the power supply line connects to source regions of the first and second load transistors,
   the first contact pad layer is used to connect the first bit line and a source/drain region of the first transfer transistor,
   the second contact pad layer is used to connect the second bit line and a source/drain region of the second transfer transistor,
   the third contact pad layer is used to connect source regions of the first and second driver transistors and the grounding line,
   the main word line extends in the first direction,
   the fourth contact pad layer is used to connect the first bit line and the source/drain region of the first transfer transistor,
   the fifth contact pad layer is used to connect the second bit line and the source/drain region of the second transfer transistor,
   the sixth contact pad layer is used to connect the source regions of the first and second driver transistors and the grounding line, and
   the first and second bit lines extend in a second direction which is perpendicular to the first direction.

6. The semiconductor memory device according to claim 1, wherein the first gate electrode layer, the second gate electrode layer, the first drain—drain connection layer and the second drain—drain connection layer have linear patterns, respectively, and are disposed in parallel with one another.

7. The semiconductor memory device according to claim 1, wherein the memory cell has a size of 4.5 $\mu m^2$ or less.

* * * * *